(12) United States Patent
Washisu

(10) Patent No.: US 7,355,154 B2
(45) Date of Patent: Apr. 8, 2008

(54) IMAGE SENSING APPARATUS WITH MOVABLE LIGHT FLUX SPLITTER AND CONTROL METHOD THEREOF

(75) Inventor: Koichi Washisu, Suginami-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 91 days.

(21) Appl. No.: 11/401,119

(22) Filed: Apr. 6, 2006

(65) Prior Publication Data

US 2006/0226341 A1 Oct. 12, 2006

(30) Foreign Application Priority Data

Apr. 11, 2005 (JP) ............................. 2005-113345

(51) Int. Cl.
G02B 7/04 (2006.01)
G02B 27/40 (2006.01)
G02B 27/64 (2006.01)

(52) U.S. Cl. ............................... 250/201.2; 250/201.4; 250/208.1; 396/11; 396/89

(58) Field of Classification Search ............. 250/201.2, 250/201.4, 208.1, 239; 348/344; 396/89, 396/11

See application file for complete search history.

(56) References Cited

U.S. PATENT DOCUMENTS

| 6,536,960 | B2* | 3/2003 | Kubo et al. | 396/355 |
| 2001/0055488 | A1* | 12/2001 | Shono | 396/429 |
| 2005/0041133 | A1* | 2/2005 | Weigel | 348/335 |

FOREIGN PATENT DOCUMENTS

| JP | 63-195630 | 8/1988 |
| JP | 2003-140246 | 5/2003 |

* cited by examiner

Primary Examiner—Davienne Monbleau
Assistant Examiner—Francis M LeGasse, Jr.
(74) Attorney, Agent, or Firm—Morgan & Finnegan, LLP

(57) ABSTRACT

An image sensing apparatus has a light flux splitter disposed between a lens that focuses light flux of an object image on an image sensing surface and that image sensing surface and that branches the light flux of the object image out of an image sensing light path, a light receiving unit that receives the light flux of the object image branched by the light flux splitter and obtains a signal for focusing control of the lens, and a holding unit that holds the light flux splitter at either an effective position within the image sensing light path or at a retracted position outside the image sensing light path. The image sensing apparatus automatically holds the light flux splitter at either the effective position or the retracted position depending on image sensing conditions.

4 Claims, 32 Drawing Sheets

(DURING PREPARATION FOR IMAGE SENSING)

(DURING IMAGE SENSING)

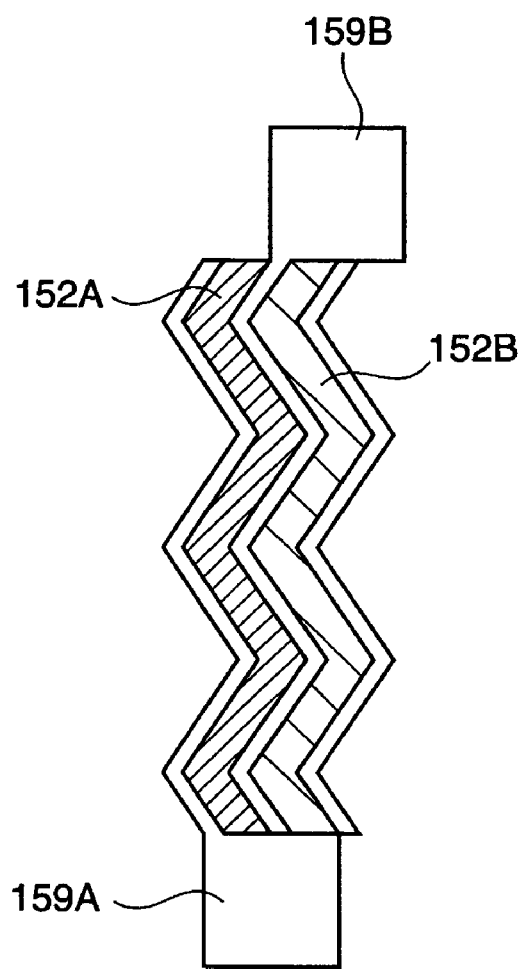
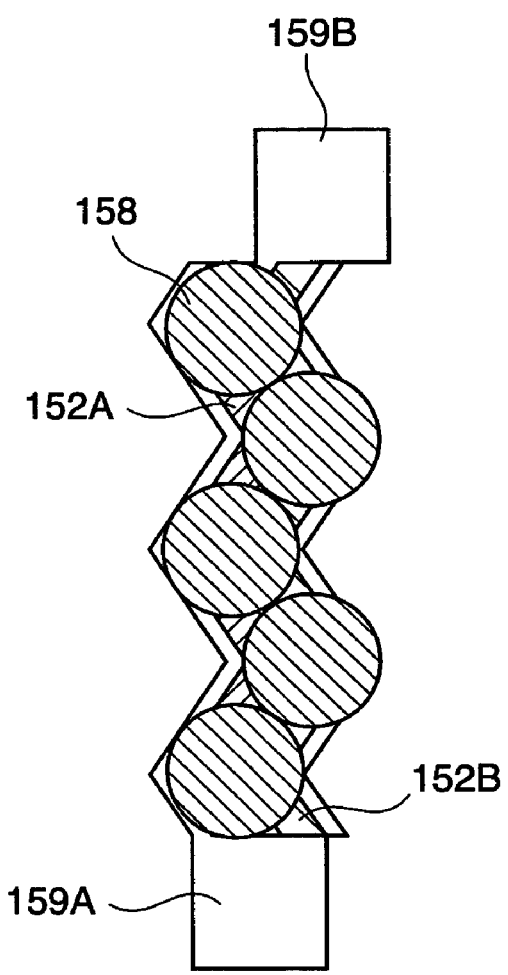

F I G. 24
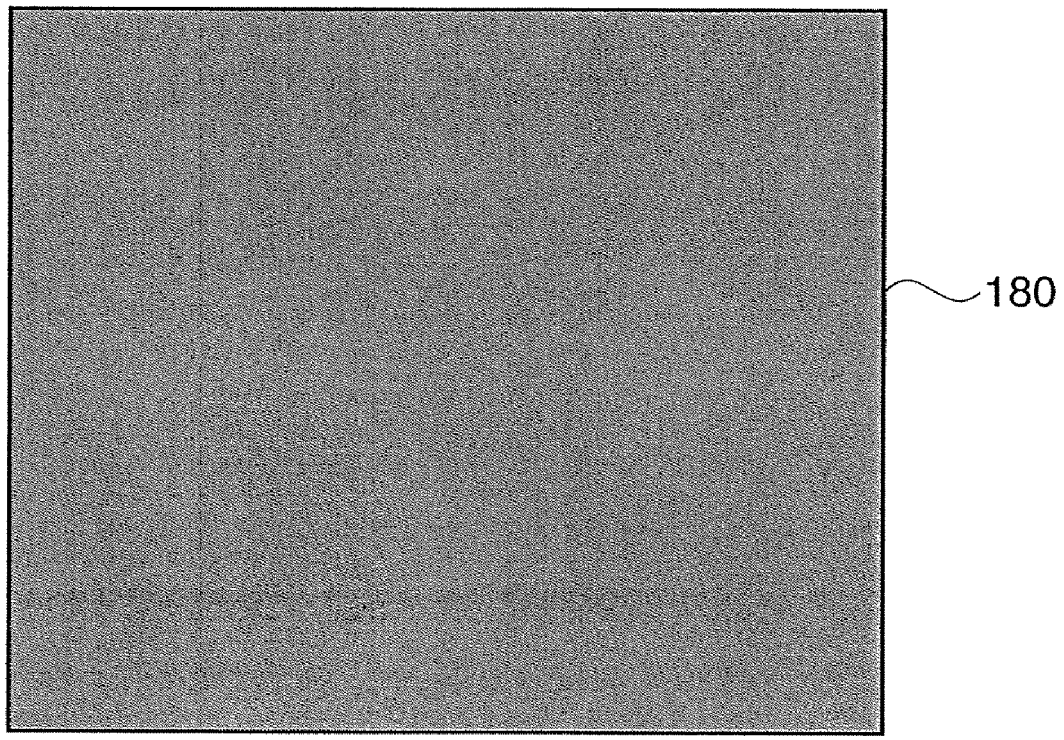

IMAGE SENSING APPARATUS WITH MOVABLE LIGHT FLUX SPLITTER AND CONTROL METHOD THEREOF

FIELD OF THE INVENTION

The present invention relates to an image sensing apparatus having a light flux splitter positioned between the lens and the image sensing surface that separates the light flux of an object image out of the image sensing light path, and a control method for such image sensing apparatus.

BACKGROUND OF THE INVENTION

Conventionally, a method of separating the light flux of an object image and directing it to a photo-sensing element for the purpose of focus detection has been proposed. For example, Japanese Laid-Open Patent Application Publication No. 63-195630 relates to a camera equipped with a zoom lens, and discloses a technology in which the light flux is split at an intermediate point along the light path of the zoom lens and focus detection is conducted using this split light flux. In addition, Japanese Laid-Open Patent Application Publication No. 2003-140246 discloses an invention relating to a digital single-lens reflex camera that focuses a primary object image formed by an image forming optical system onto a two-dimensional photo-sensing sensor such as a CCD sensor or a CMOS sensor, photoelectrically converts the optical image thus obtained, and obtains image output for that object.

In the foregoing proposals, the light flux of an object image is divided by a splitter or other light flux splitter and separately incident on the image sensor and the focus detection sensor, with detection of the state of focus carried out on the focus detection sensor side and image sensing carried out on the image sensor side.

In the conventional examples described above, the splitter or other such light flux splitter is provided within the light flux of an object image. However, using such a light flux splitter generally diminishes the amount of light that reaches the image sensor. To counteract this effect, the light flux splitter may be retracted during image sensing so that all the light strikes the image sensor, but retracting the light flux splitter with every sensing of an image leads to shutter time lag.

SUMMARY OF THE INVENTION

The present invention has been made in light of the above-described situation, and has as its object to provide an image sensing apparatus that eliminates shutter time lag during image sensing as the light flux splitter is retracted while capable of carrying out good image sensing, and a control method for such an image sensing apparatus.

According to the present invention, the foregoing object is attained by providing an image sensing apparatus comprising:

a light flux splitter disposed between a lens that focuses light flux of an object image on an image sensing surface and that image sensing surface and that branches the light flux of the object image out of an image sensing light path;

a light receiving unit that receives the light flux of the object image branched by the light flux splitter and obtains a signal for focusing control of the lens; and a holding unit that holds the light flux splitter at either an effective position within the image sensing light path or at a retracted position outside the image sensing light path, wherein the image sensing apparatus automatically holds the light flux splitter at either the effective position or the retracted position depending on image sensing conditions.

In addition, according to the present invention, the foregoing object is also attained by providing A control method for an image sensing apparatus having a light flux splitter disposed between a lens that focuses light flux of an object image on an image sensing surface and that image sensing surface and that branches the light flux of an object image out of an image sensing light path, a light receiving unit that receivers the light flux of the object image branched by the light flux splitter and obtains a signal for focusing control of the lens; and a holding unit that holds the light flux splitter at either an effective position within the image sensing light path or at a retracted position outside the image sensing light path, the control method comprising:

determining whether to carry out image sensing with the light flux splitter at the effective position or at the retracted position depending on image sensing conditions; and retracting the light flux splitter to the retracted position prior to image sensing if it is determined that image sensing is to be carried out with the light flux splitter positioned at the retracted position.

Other objects, features and advantages of the present invention will be apparent from the following description when taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 13A and 13B are plan views of a photoelectric conversion part of one pixel of the image sensing element according to the first embodiment of the present invention;

FIG. 24 is a diagram showing unevenness in luminance of an image in the first embodiment of the present invention;

DETAILED DESCRIPTION OF THE PREFERRED EMBODIMENTS

Preferred embodiments of the present invention will now be described in detail in accordance with the accompanying drawings. However, the dimensions, shapes and relative positions of the constituent parts shown in the embodiments should be changed as convenient depending on various conditions and on the structure of the apparatus adapted to the invention, and the invention is not limited to the embodiments described herein.

First Embodiment

Figure 1:
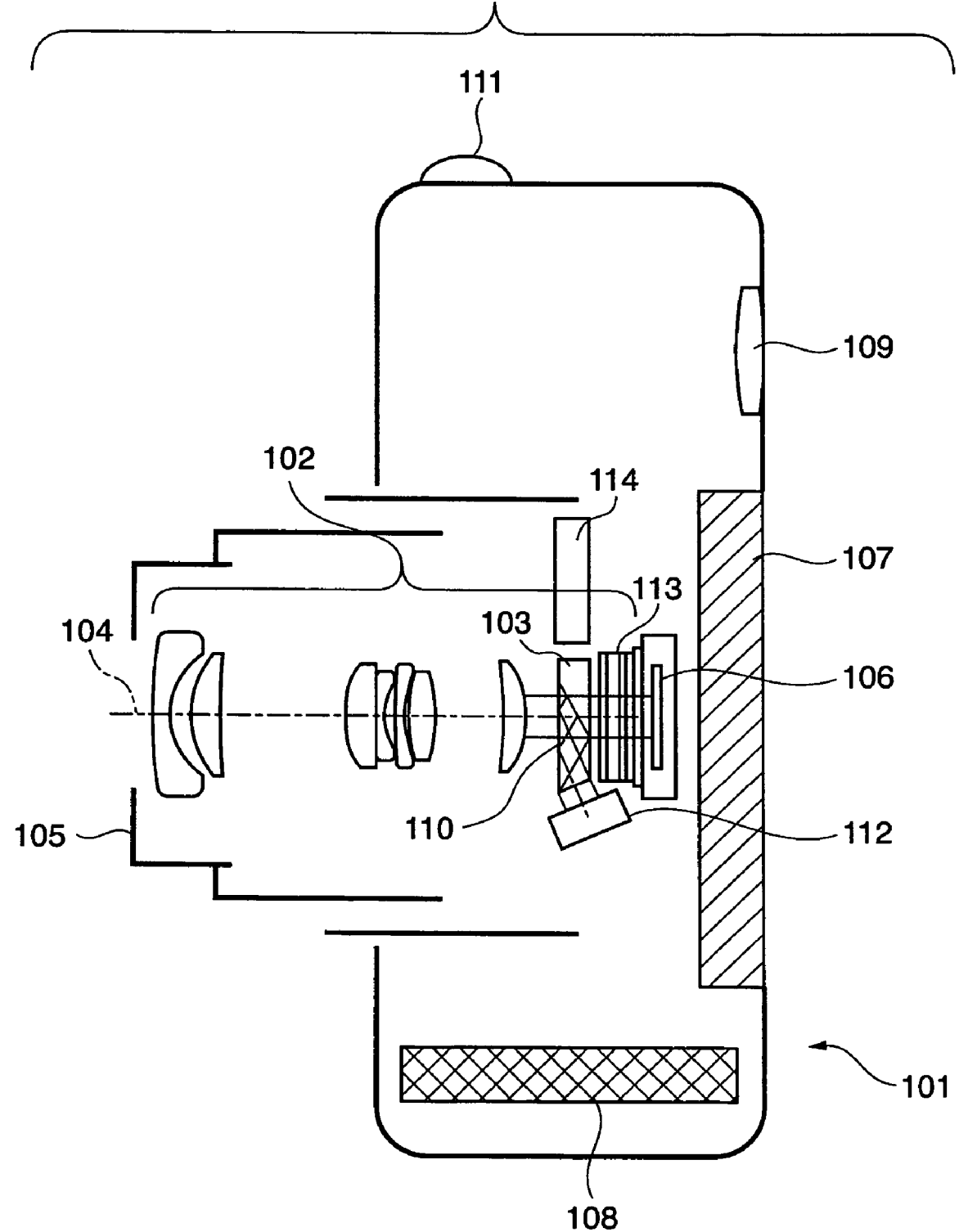
FIG. 1 is a sectional view of the essential structure of a digital camera according to a first embodiment of the present invention.

FIG. 1 shows a sectional view of a digital camera according to a first embodiment of the present invention.

In FIG. 1, reference numeral 101 designates a digital camera, 102 designates an image forming optical system for forming an image of an object, 104 designates the optical axis of the image forming optical system 102 and 105 designates a lens barrel that contains the image forming optical system 102.

The above-described image forming optical system 102 can adjust the position of the image forming position in the direction of the optical axis 104 by an energy source, not shown, and a drive mechanism, not shown. The focusing lens may be composed of a flexible transparent elastic member and a fluid lens so that it can also focus on an object by varying the surface shape and changing the refracting power of the focusing lens. The image forming optical system 102 may also be a single focus lens, a zoom lens, or a shift lens and the like. In addition, the image forming optical system 102 may also be made so as to be interchangeable with an image forming optical system equipped with a variety of characteristics (F-number, focal distance and so forth). A composite material consisting of acrylic resin uniformly coated with particles of niobium oxide approximately 5 nm to 30 nm in size may be used as the material for the lens that comprises the image forming optical system 102. In that case, the lens has a high refractive index of approximately 1.8 yet is more resistant to shock than glass, and furthermore, can be manufactured inexpensively by injection molding.

Reference numeral 103 designates a splitter that splits a light flux, 110 designates the optical axis inside the splitter 103, 111 designates a shutter release button, 108 designates a memory card that stores image data, 109 designates an optical viewfinder eyepiece, 106 designates an image sensing element such as a two-dimensional CCD and CMOS photoreceptive sensor, 112 designates a focus detection sensor (an AF sensor) included in an AF module and 113 designates an optical low-pass filter. During acquisition and image sensing of an image displayed on a display device 107 that is described later, a light flux passing through the splitter 103 and the optical low-pass filter 113 is projected onto the image sensing element 106. Reference numeral 114 designates a plane parallel plate optical member for correcting the light path length, and functions to correct variations in the light path length due to retraction of the splitter 103 from within the light flux (along the optical axis 104).

Reference numeral 107 designates the aforementioned display device, mounted on a rear surface of the camera. Images of objects taken by the image sensing element 106 are displayed on this display device 107. The user can determine the composition of image sensing by observing the display device 107 directly in preparation for image sensing. The display device 107 is composed of an organic EL (ectroluminescence) spatial modulation element, a liquid crystal spatial modulation element, a spatial modulation element that utilizes the electrophoresis of particles or the like, and thus consumes little power, is compact, thin, and conveniently easy to use.

The image sensing element 106 performs image output for the display device 107 using interlaced scanning and high-definition scanning of reading out all pixels during image sensing.

Figure 2:
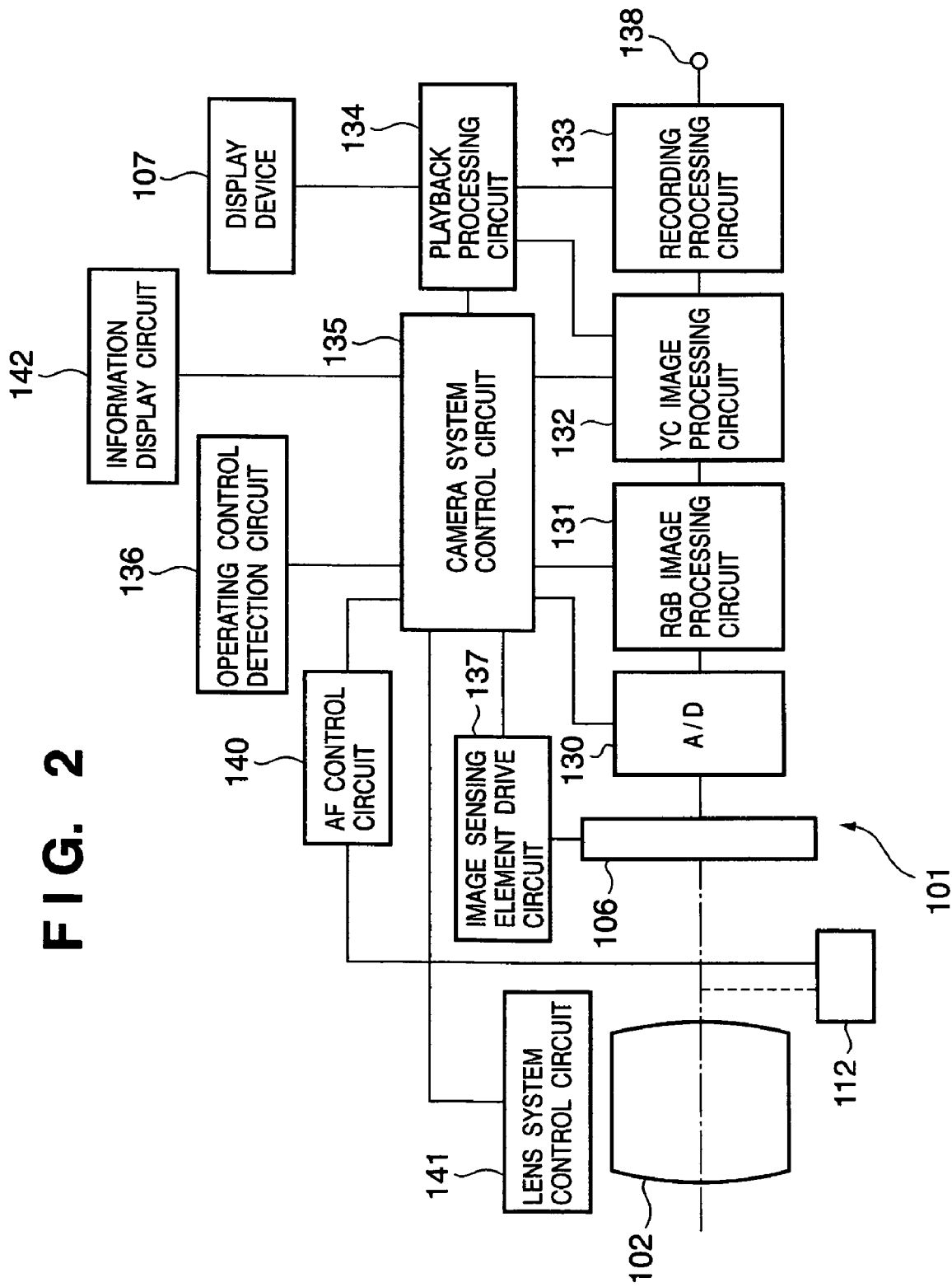
FIG. 2 is a block diagram showing the electrical structure of the digital camera shown in FIG. 1.

FIG. 2 is a block diagram showing the electrical structure of the digital camera 101.

The digital camera 101 comprises an image sensing system, an image processing system, a recording and playback system and a control system. The image sensing system includes the image forming optical system 102 and the image sensing element 106. The image processing system includes an A/D converter 130, an RGB image processing circuit 131 and a YC processing circuit 132. The recording and playback system includes a recording processing circuit 133 and a playback processing circuit 134. The control system includes a camera system control circuit 135, an information display circuit 142, an operating control detection circuit 136 and an image sensing element drive circuit 137. Reference numeral 138 designates a connection terminal connected to an external computer or the like and standardized to transmit and receive data. These electrical circuits are, for example, driven by a miniature fuel cell, not shown. It should be noted that the type of power source is not limited to a fuel cell, and alternatively any ordinary power source can be used.

The image sensing system is an optical processing system that focuses light from an object onto an image sensing surface of the image sensing element 106 through the image forming optical system 102. It controls a diaphragm and a mechanical shutter, not shown, of the image forming optical system 102 so that the image sensing element 106 is exposed to an appropriate amount of light from the object. A photosensing element having, for example, a total of 8 million pixels arranged in a rectangular array 3264 pixels in the long direction and 2448 pixels in the short direction may be used for the image sensing element 106. The pixels of the photo-sensing element are arranged, for example, in a so-called Bayer arrangement, consisting of red (R), green (G) and blue (B) color filters arranged alternately, with four pixels forming a set. In the Bayer arrangement, overall image performance is improved by providing more of the pixels of G to which an observer is more sensitive than the R or B pixels. In general, in image processing using this type of image sensing element, most of the luminance signal is generated from the G whereas the color signal is generated from the R, G, and B.

The image signal read out from the image sensing element 106 is supplied to the image processing system through the A/D converter 130. The A/D converter 130 is a signal conversion circuit that converts the signals from the pixels that are exposed into, for example, 12-bit digital signals depending on the amplitude of the signals and outputs the resulting 12-bit digital signals, with succeeding image signal processing executed as digital processing.

The image processing system is a signal processing circuit that obtains image signals of a desired format from the R, G, B digital signals, and coverts the R, G, B color signals into a luminance signal Y and YC signals expressed as color difference signals (R-Y) and (B-Y). The RGB image processing circuit 131 is a signal processing circuit that processes the image signals of the pixels received from the image sensing element 106 through the A/D converter 130, and has a white balance circuit, a gamma correction circuit and an interpolation calculation circuit that boosts image resolution by interpolation computation.

The YC processing circuit 132 is a signal processing circuit that generates a luminance signal Y and color difference signals (R-Y) and (B-Y). The YC processing circuit 132 comprises a high-luminance signal generating circuit that generates a high-luminance signal YH, a low-luminance signal generating circuit that generates a low-luminance signal YL, and a color difference signal generating circuit that generates color difference signals (R-Y) and (B-Y). The luminance signal Y is formed by combining the high-luminance signal YH and the low-luminance signal YL.

The recording and playback system is a processing system that outputs image signals to the memory and outputs image signals to the display device 107. The recording processing circuit 133 writes image signals into and reads image signals out from the memory, and the playback processing circuit 134 plays back image signals read from the memory and outputs the image signals to the display device 107. In addition, the recording processing circuit 133 has a built-in compression/expansion circuit that compresses the YC signals that express still images and moving images using a predetermined compression format and expands the compressed data when it is read out. The compression/expansion circuit includes a frame memory and the like for signal processing, and the YC signals from the image processing system are accumulated in the frame memory one image at a time, each of which is read out and compression-encoded at each plurality of blocks. The compression encoding is carried out, for example, by two-dimensional orthogonal transform, normalization and Huffman encoding. The playback processing circuit 134 is a circuit that matrix-transforms the luminance signal Y and the color difference signals (R-Y) and (B-Y), and converts them into, for example, an RGB signal. The signals converted by the playback processing circuit 134 are output to the display device 107, where they are displayed and reproduced as visible images.

The control system includes the operating control detection circuit 136 that detects operations of the shutter release button 111 and the like, and the camera system control circuit 135 that controls the parts of the camera 101 in response to the detected signals and generates and outputs timing signals during image sensing and the like. The control system further includes the image sensing element drive circuit 137, which generates drive signals that drive the image sensing element 106, and the information display circuit 142, which controls the information display device inside the optical viewfinder and the information display device on the outside of the camera, under the control of the camera system control circuit 135. In addition, the control system controls the image sensing system, the image processing system and the recording and playback system in response to external operations, so as to, for example, detect depression of the shutter release button 111 and control the driving of the image sensing element 106, the operation of the RGB image processing circuit 131 and the compression processing of the recording processing circuit 133, and further, controls the state of each segment of the information display device that displays information in the optical viewfinder and the like carried out by the information display device 142.

An AF control circuit 140 and a lens system control circuit 141 are further connected to the camera system control circuit 135. The AF control circuit 140 and the lens system control circuit 141 exchange data needed for individual processes performed through the camera system control circuit 135. The AF control circuit 140 obtains the signal output of a focus detection field of view of the focus detection sensor 112 set so as to correspond to a predetermined position on the image sensing screen and generates a focus detection signal, and detects the state of image formation of the image forming optical system 102. A state of defocus, if detected, is converted into a drive amount for the focusing lens that is one element of the image forming optical system 102 and relayed through the camera system control circuit 135 to the lens system control circuit 141. In addition, with respect to a moving object, the AF control circuit 140 considers the time lag from the time the shutter release button 111 is pressed to the time at which actual image sensing control commences, predicts the appropriate lens position and orders the requisite focusing lens drive amount. When it is determined that the luminance of the object is low and adequate focus detection accuracy cannot be obtained, the AF control circuit 140 illuminates the object with an flash device, not shown, or a white LED or fluorescent light, not shown, to compensate for the inadequate luminance.

When the lens system control circuit 141 receives the instruction indicating the drive amount of the focusing lens, it moves the focusing lens in the image forming optical system 102 along the optical axis 104 using a drive mechanism, not shown, and focuses on the object. When as a result of a sequence of focus adjustment operations the AF control circuit 140 detects that the image is in focus, this information is transmitted to the camera system control circuit 135. At this time, when the shutter release button 111 is pressed to a second stage and the splitter 103 should be retracted from the light path, the splitter 103 and the plane parallel plate 114 are exchanged by a mechanism that is described later. Then, a high-definition image is formed by the light flux that passes through the optical low-pass filter 113, accomplishing image sensing control via the image sensing system, the image processing system, and the recording and playback system as described above. At this point, the plane parallel plate 114 is inserted at the position where the splitter 103 was so that fluctuations in the focus of the image forming optical system 102 do not occur, and thus there is no need to correct the focus. Therefore, it is possible to provide a short release-time lag without adversely affecting high-speed focus detection.

Figure 3:
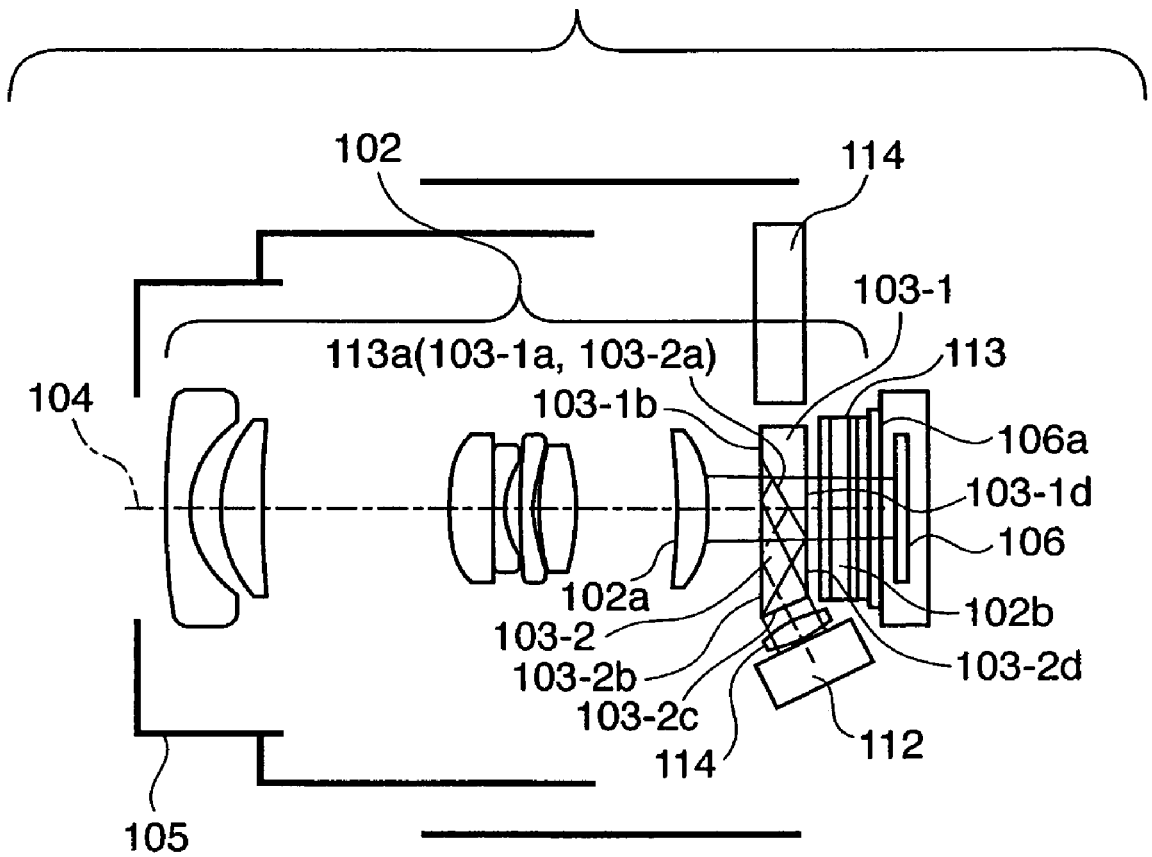
FIG. 3 is a structural diagram showing a lens barrel portion in a case in which a splitter is at an effective position in the digital camera shown in FIG. 1.
Figure 4:
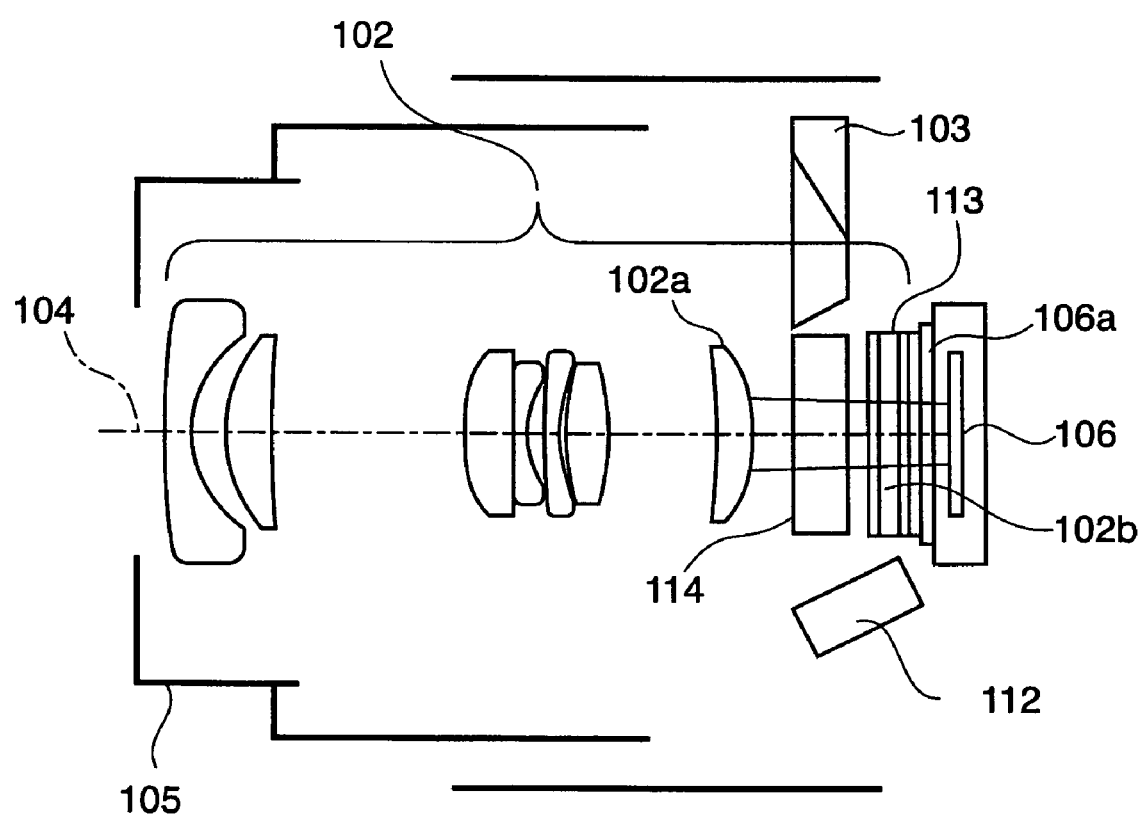
FIG. 4 is a structural diagram showing the lens barrel portion in a case in which the splitter is at a retracted position in the digital camera shown in FIG. 1.
Figure 5:
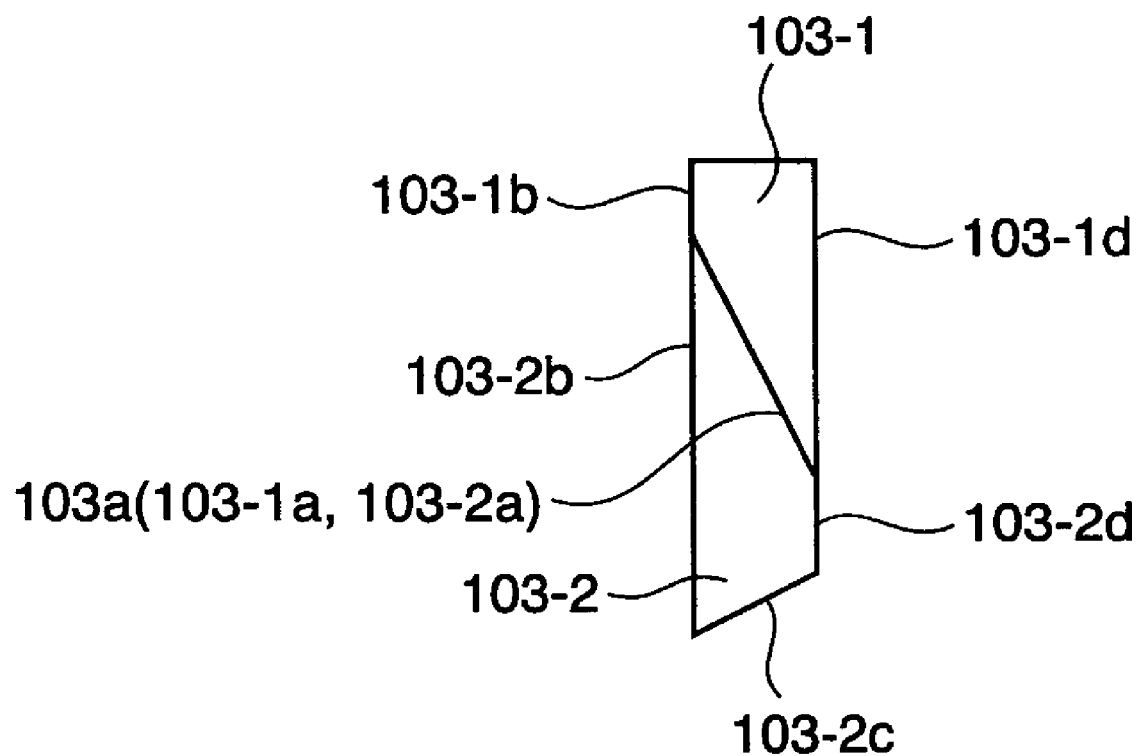
FIG. 5 is a sectional view of the splitter shown in FIG. 2.
Figure 6:
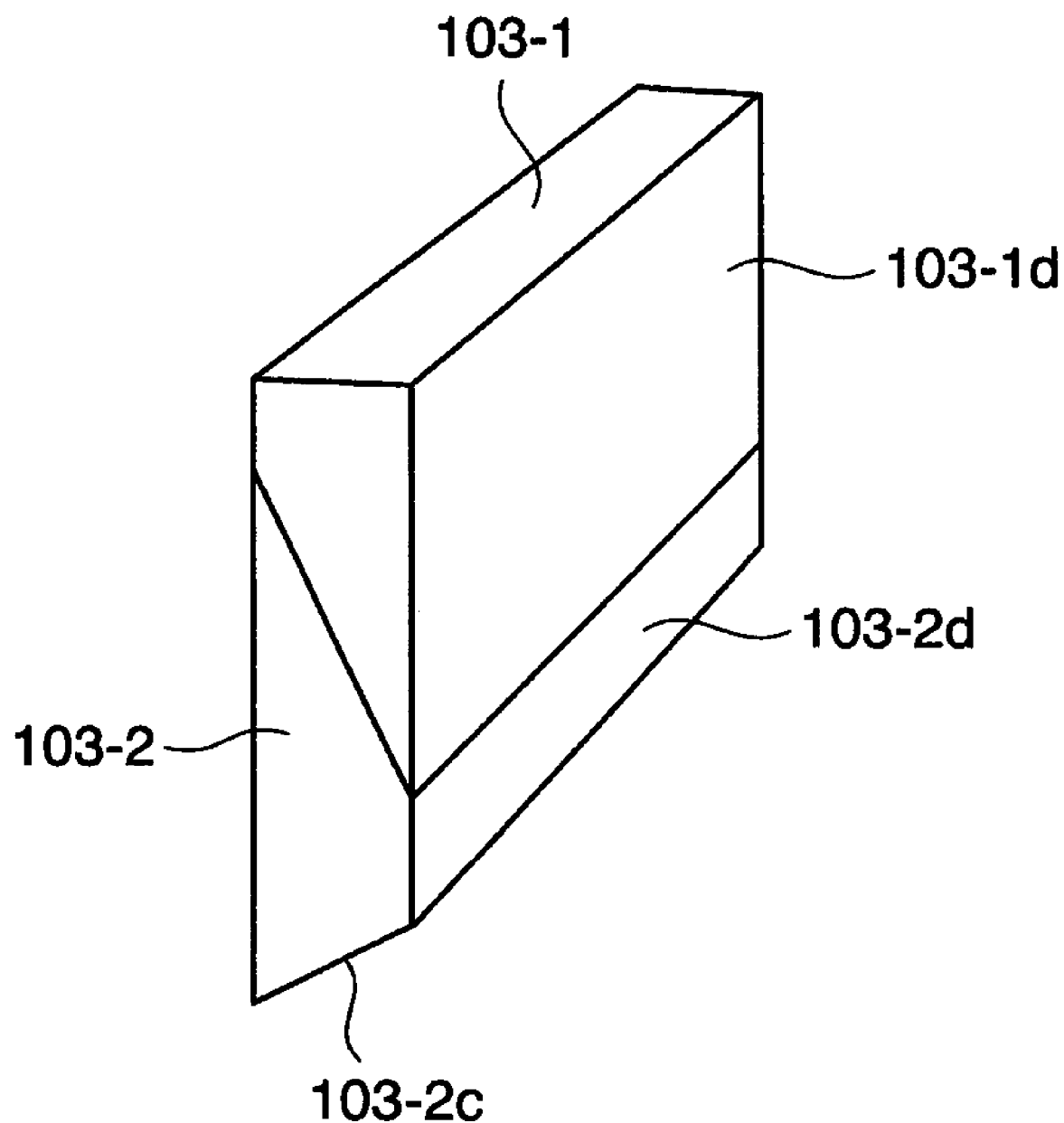
FIG. 6 is perspective view of the splitter shown in FIG. 2.
Figure 7:
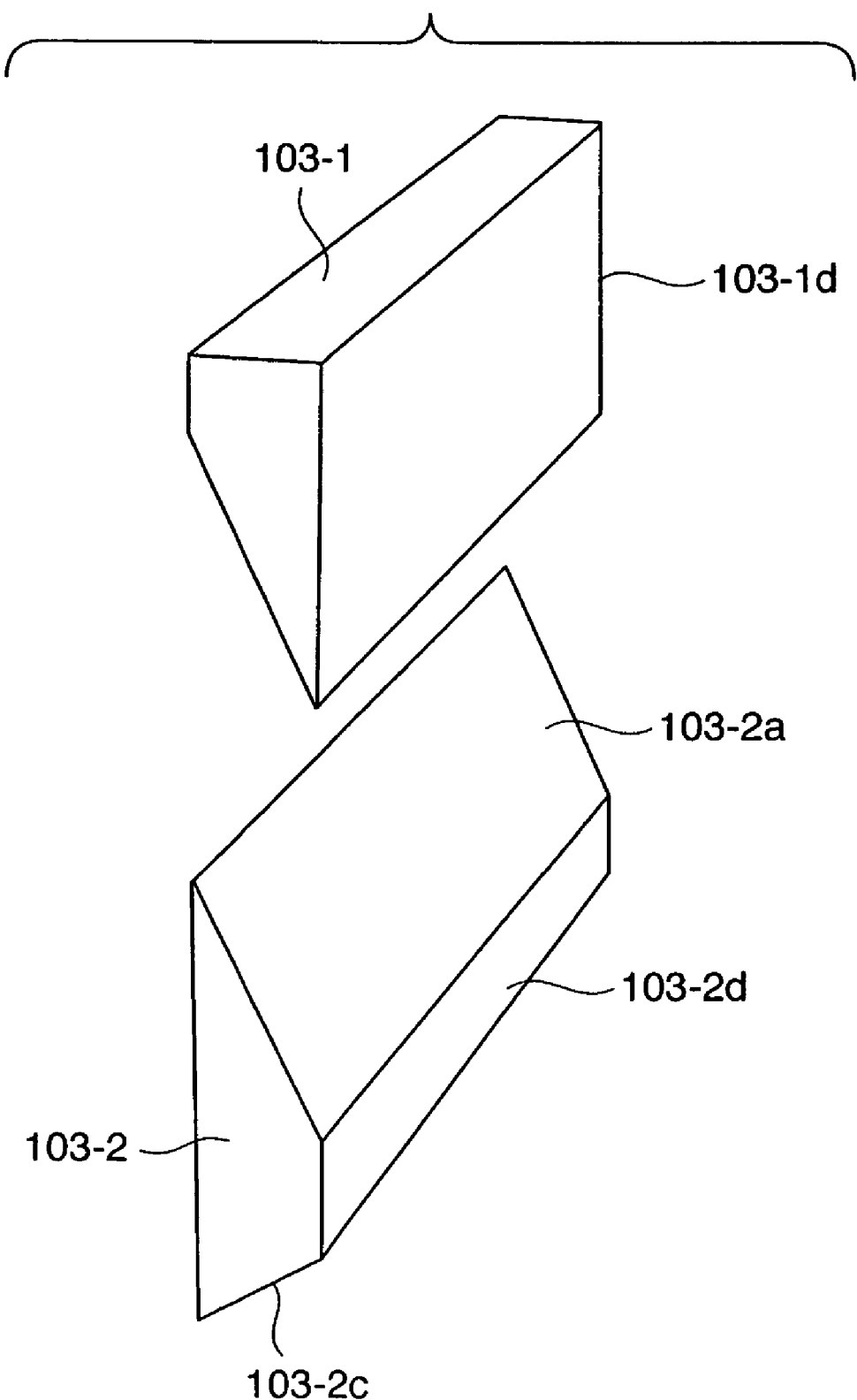
FIG. 7 is an exploded perspective view of the splitter shown in FIG. 2.

FIG. 3 is a sectional view of the lens barrel 105 portion of the digital camera 101 preparatory to image sensing, FIG. 4 is a sectional view of an image sensing state, FIG. 5 is a sectional view of the splitter 103, FIG. 6 is perspective view of the splitter 103 and FIG. 7 is an exploded perspective view of the splitter 103. A detailed description is now given of the splitter 103 and its peripheral units using the foregoing drawings.

The splitter 103 is positioned between the rear end of the lens group of which the image forming optical system 102 is comprised and the image sensing element 106. Reference numeral 102a designates the focusing lens, which adjusts the focus by moving along the optical axis 104. The image sensing element 106 is fixed in position with respect to a fixed floor panel, not shown, of the lens barrel 105. In addition, the optical length of the splitter 103 in the visible wavelength range is made to match an optical length determined by the thickness of the plane parallel plate 114. Thus, when the splitter 103 shown in FIG. 3 is retracted and the plane parallel plate 114 is inserted in place of the splitter 103 as shown in FIG. 4, the state of focus on the image sensing element 106 of the image forming optical system 102 does not change.

The general image sensing sequence is as follows: When it is detected that the shutter release button 111 is depressed to the first stage, the image sensing element 106 is driven and the object image formed with the light flux that passes through the splitter 103 is repeatedly sensed and the object image is displayed in real time on the display device 107. In addition, focus detection is carried out using the focus detection sensor 112 with the light flux of the visible wavelength range split by the splitter 103. If the extent of defocus meets or exceeds a predetermined amount, the extent to which the focusing lens 102a is to be driven is calculated and the focusing lens 102 is moved along the optical axis 104 by that amount and focusing control is carried out. After focusing control is completed, focus detection is carried out using the focus detection sensor 112 again. Once it is confirmed that the amount of defocus is within a predetermined range, focus display by sound and light is provided.

When it is detected that the shutter release button 111 is depressed to the second stage and the splitter 103 should be retracted from the light path for example during exposure, the splitter 103 is retracted from the light path of the image forming optical system 102 by a mechanism that is described later and the plane parallel plate 114 is inserted in its place (see FIG. 4). The image sensing element 106 is driven and image sensing is carried out in the high-definition mode. Then, after image sensing is completed, the plane parallel plate 114 is retracted from the light path of the image forming optical system 102 and the splitter 103 is returned to its original position (see FIG. 3). Image data pertaining to the sensed object image is then written to the memory.

Next, a detailed description is given of the light splitting function. As shown in FIGS. 5-7, the splitter 103 comprises two prisms, 103-1 and 103-2, adhered together at a light splitting surface 103a. The light entry surface of the splitter 103 is formed by a surface 103-1b of the prism 103-1 and a surface 103-2b of the prism 103-2, and the exit surface for light advancing straight ahead is formed by a surface 103-1d of the prism 103-1 and a surface 103-2d of the prism 103-2. There is no gap between surface 103-1b of prism 103-1 and surface 103-2b of prism 103-2, and there is no gap between surface 103-1d of prism 103-1 and surface 103-2d of prism 103-2. In addition, the surfaces 103-1b and 103-1d of prism 103-1 and the surfaces 103-2b and 103-2d of prism 103-2 are parallel.

The surface 103-b1 of the prism 103-1 and the light splitting surface 103a, and the surface 103-2d of the prism 103-2 and the light splitting surface 103a, have different angles of inclination. Surface 103-1b and light splitting surface 103a, and surface 103-2d and light splitting surface 103a, respectively, intersect.

Figure 8:
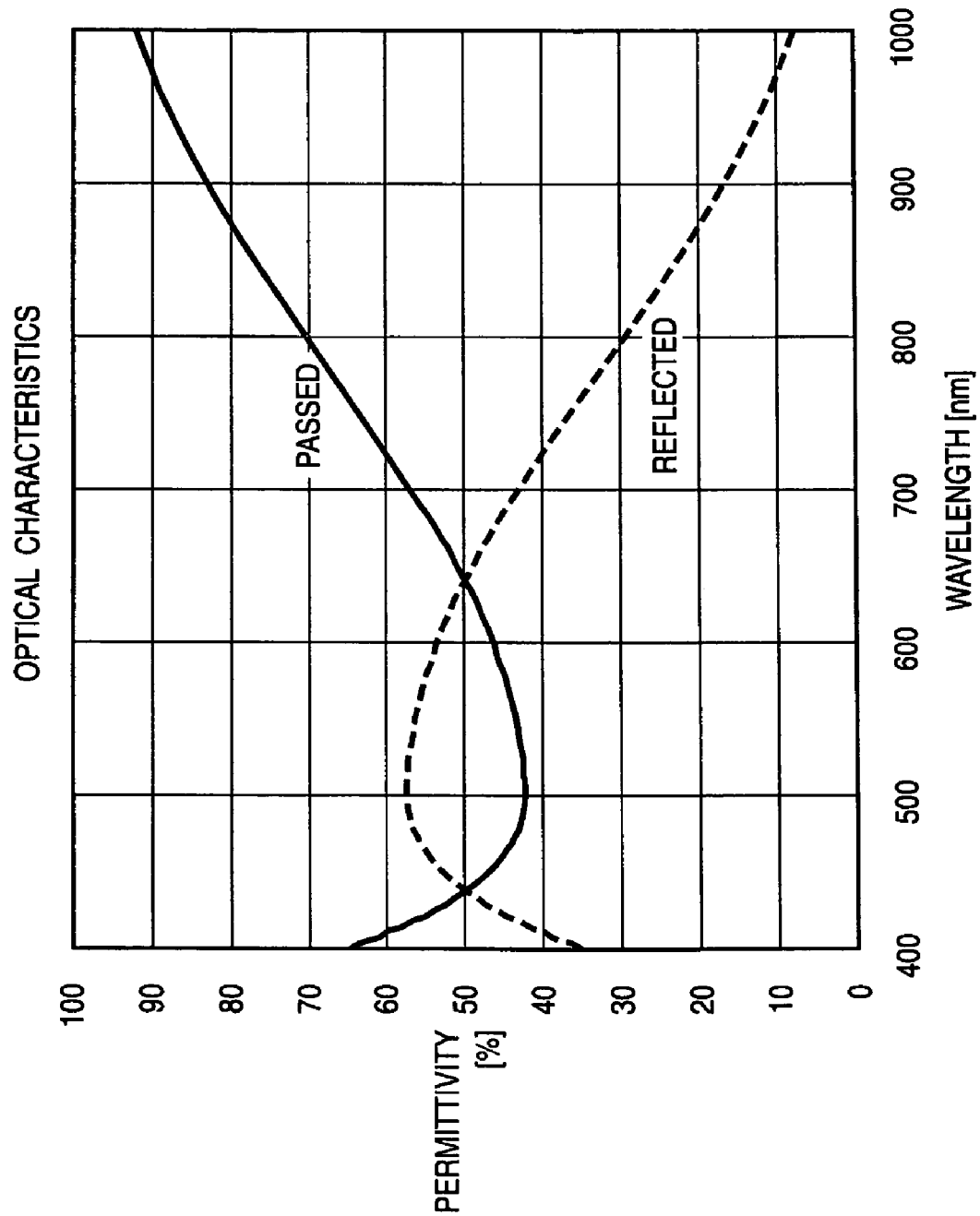
FIG. 8 is a diagram showing the optical characteristics of a light splitting surface of the splitter shown in FIG. 2.

The light splitting surface 103a of the splitter 103 is formed by forming a dielectric multilayer film on a surface 103-2a of the prism 103-2 and affixing it to a surface 103-1a of the prism 103-1 using an index-matching optical adhesive to obtain the desired optical characteristics. The optical characteristics of the light splitting surface 103a are as shown in FIG. 8. The spectral transmittance characteristics of wavelengths from 400 nm to 1000 nm form a concave-up curve with its minimum value near 500 nm, whereas the spectral reflectance characteristics form a concave-down curve with its maximum value near 500 nm. In other words, the light splitting surface 103a reflects a portion of the entering light of a predetermined wavelength range and permits the rest to pass through. As the distinctive feature of the dielectric multilayer film, absorption can be made small enough so that it can be substantially ignored, and thus at the light splitting surface 103a the entering light is divided in the directions toward the image sensing element 106 and toward the focus detection sensor 112.

In a visible spectrum range from 450 nm to 650 nm, it can be seen that the spectral transmittance is constant at about 45 percent. In a color camera, the photographic sensitivity range of the image sensing element 106 is made to match the visible light range, and thus the spectral reflectance in the sensitive wavelength range of the image sensing element 106 can be said to be flat.

Of the light fluxes striking the splitter 103 from the light entry surface formed by surface 103-1b of prism 103-1 and surface 103-2b of prism 103-2, the light flux reflected by the light splitting surface 103a is totally reflected at surface 103-2b and exits from surface 103-2c. The focus detection sensor 112 is disposed at a position opposing to surface 103-2c and the light flux from the splitter 103 strikes the light splitting surface 103a, by which the focus detection function operates.

The spectral characteristics of the light flux split by the splitter 103 as described above are substantially the same as those of the light that travels straight ahead, and it is this light flux that triggers the focus detection function. The spectral reflectance here is approximately 55 percent, making high-accuracy focus detection due to an adequate amount of light possible. It should be noted that, in order to match the spectral sensitivity of the focus detection sensor 112 exactly to the image sensing element 106, it is better still to add an infrared ray cut-out function to the entry surface protective glass of the focus detection sensor 112.

An ND (Neutral Density) filter is formed on surface 103-1b of prism 103-1 and surface 103-2b of prism 103-2. The ND filter is a type of light-absorbing film, in which vapor coating of chromel or the like is used to obtain flat transmittance characteristics over a very wide range of wavelengths. Chromel is a metal alloy composed chiefly of nickel, in a composition ratio of Cr: 7.0-10.5 percent, Mn: 1.5 percent or less, and Si: 1.0 percent or less.

Figure 9:
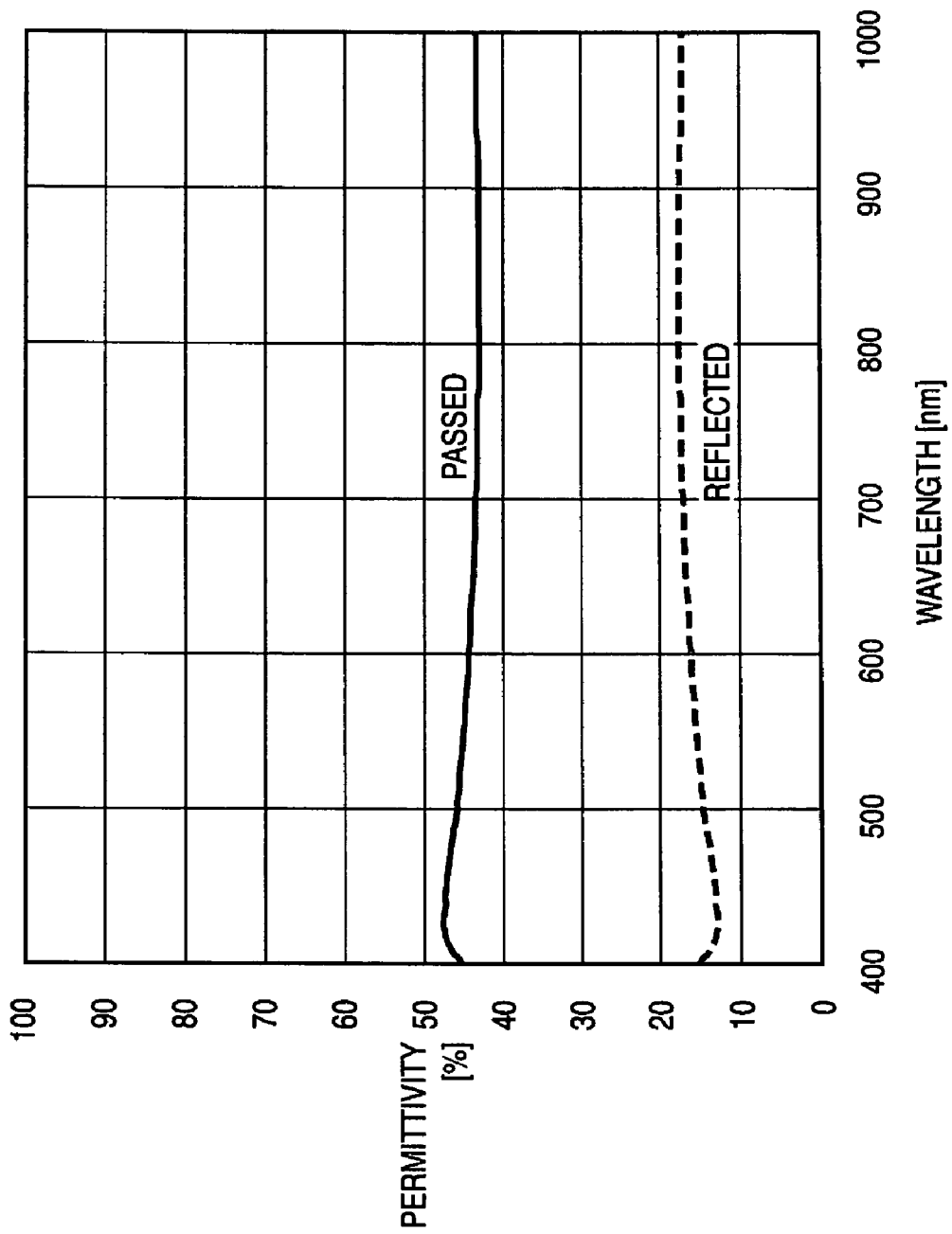
FIG. 9 is a diagram showing an example of the optical characteristics of an ordinary ND filter used in a digital camera.

FIG. 9 shows an example of the optical characteristics of an ND filter formed using chromel vapor coating. In the visible spectrum range from 450 nm to 650 nm, the spectral transmittance is constant at approximately 45 percent, and with such high absorption the spectral reflectance in this range is approximately 15 percent.

Figure 10:
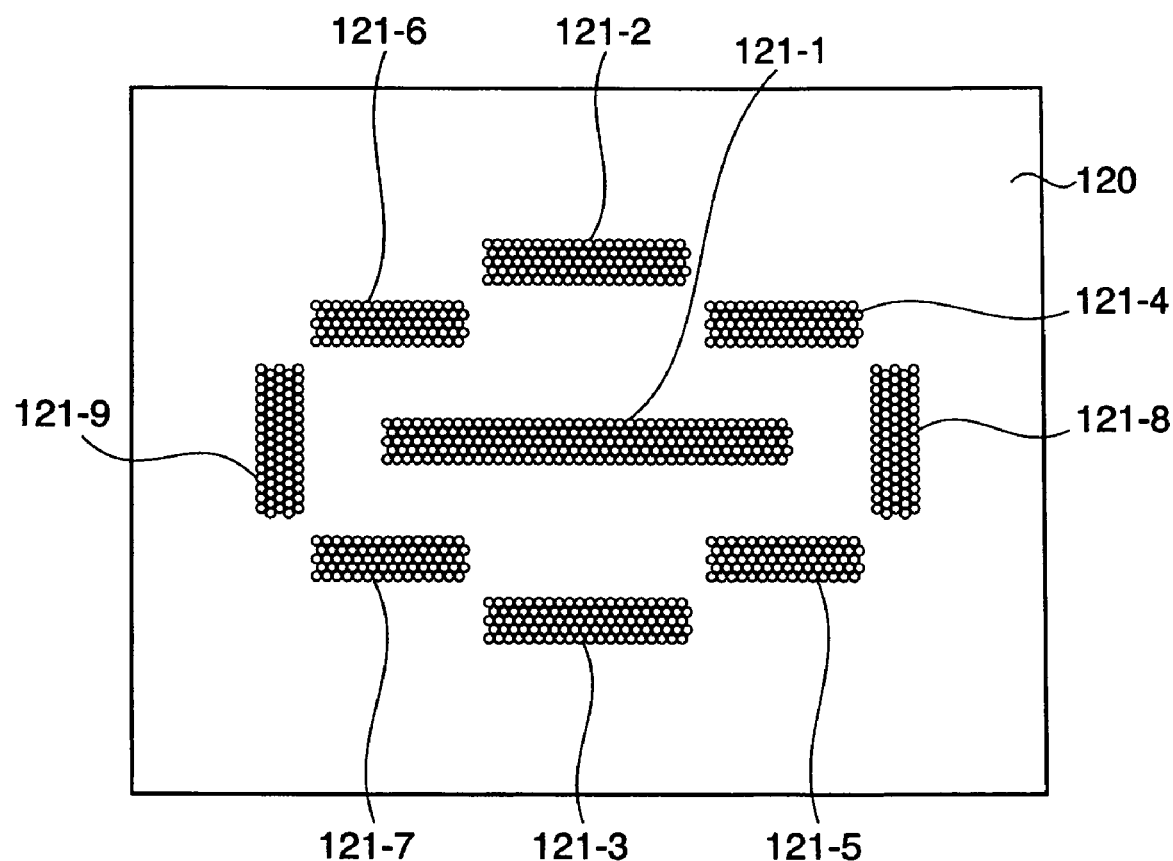
FIG. 10 is a focus detection view field generated by an AF module according to the first embodiment of the present invention.

Next, a description is given of the focus detection sensor 112. FIG. 10 shows a focus detection view field of the focus detection sensor 112.

Figure 11:
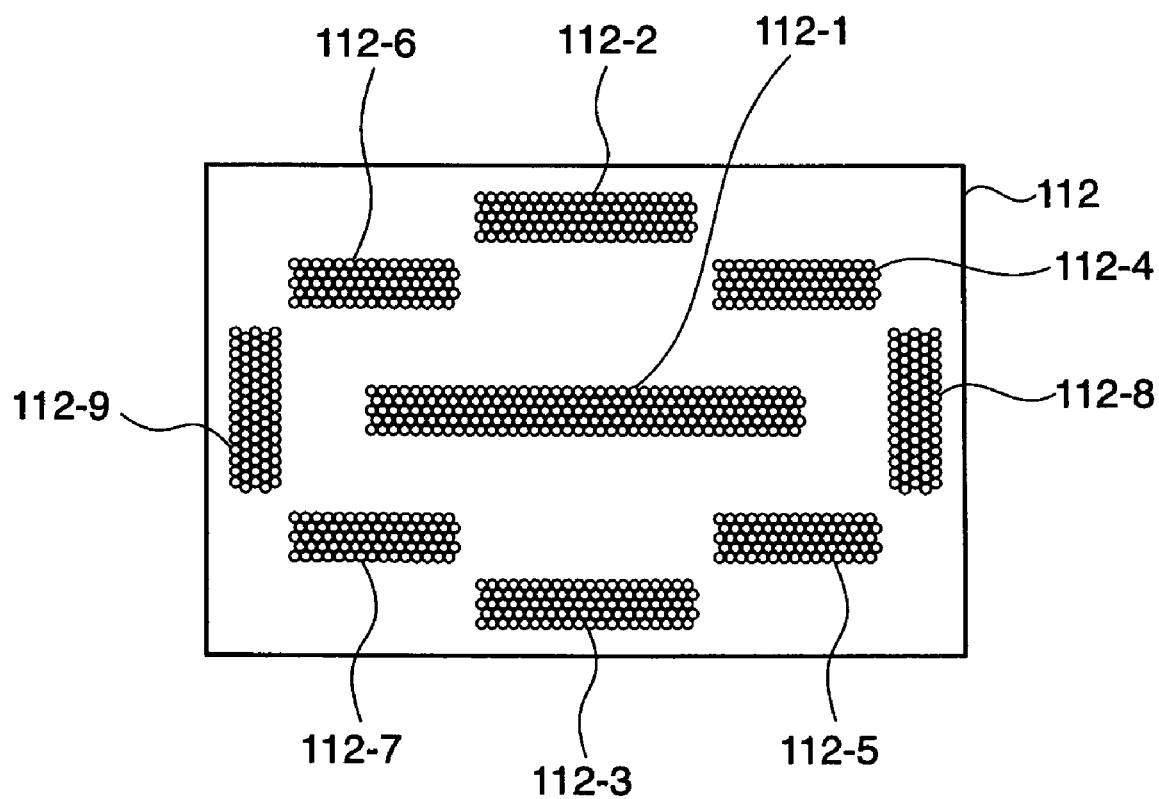
FIG. 11 is a plan view of a focus detection surface of an AF module according to the first embodiment of the present invention.

In FIG. 10, reference numeral 120 designates a viewfinder view field in which the image sensing range is made to coincide with the observation range, with reference numerals from 121-1 to 121-9 delineating the focus detection view field. Setting the focus detection view field near the center of the image sensing range makes the camera easy to use. The focus detection view field comprised of columns of pixels in the vertical direction is sensitive to vertical luminance distribution, thus enabling, for example, focus detection of horizontal lines. At the same time, the focus detection view field comprised of rows of pixels in the horizontal direction is sensitive to the horizontal luminance distribution, thus enabling, for example, focus detection of vertical lines, The actual focus detection sensor 112 is configured as shown in FIG. 11. FIG. 11 is a plan view of the focus detection sensor 112, with reference numerals from 112-1 to 112-9 designating pixel arrays forming focus detector views field 121-1 to 121-9.

Figure 12:
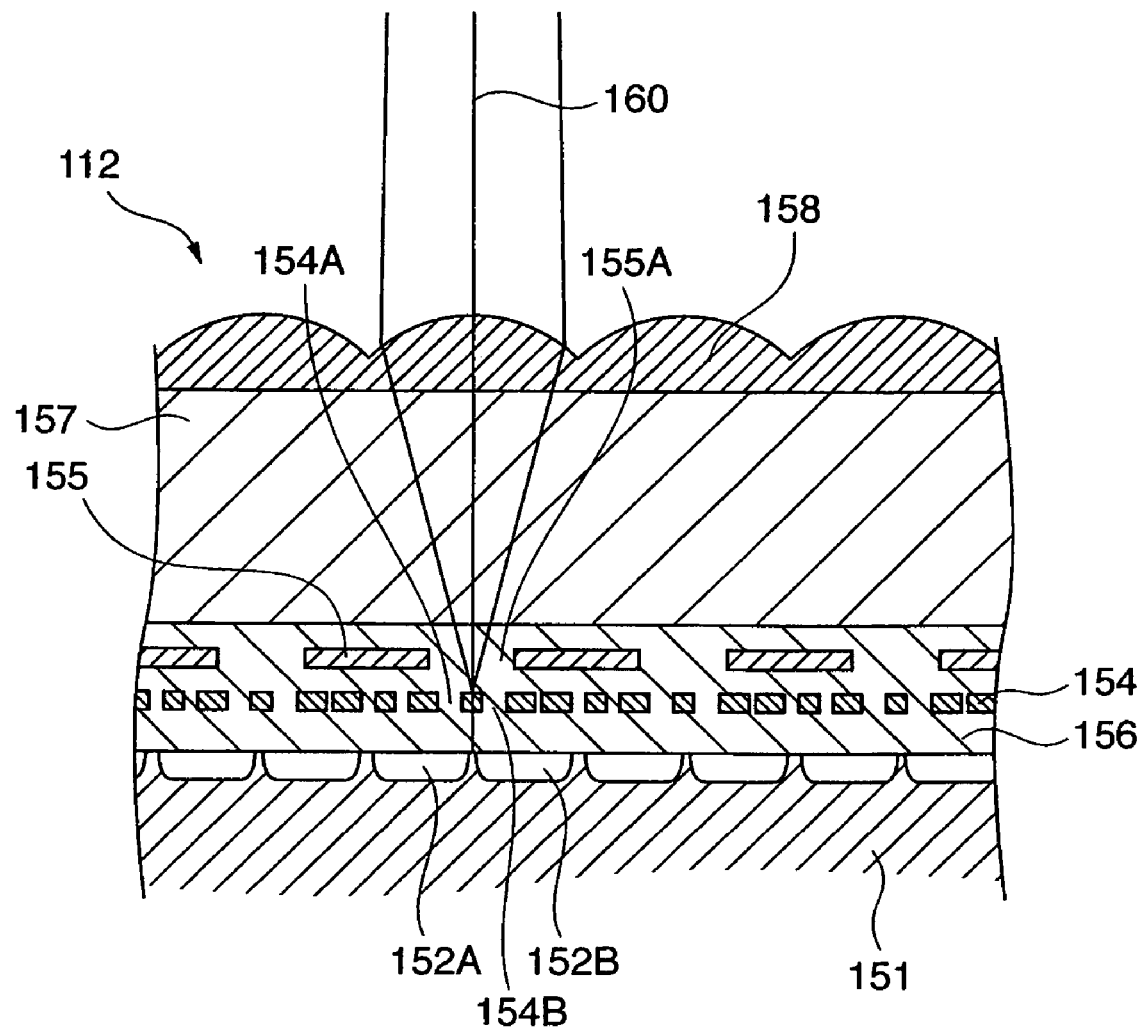
FIG. 12 is a sectional view of the pixel part of an image sensing element according to the first embodiment of the present invention.

FIG. 12 is a sectional view of the pixel part of a focus detection view field (for example 121-1) of the image sensing element 112. FIG. 13A is a plan view of a photoelectric conversion part of one pixel of the image sensing element 112. FIG. 13B shows a microlens disposed atop the photoelectric conversion part shown in FIG. 13A.

Light, in FIG. 12, strikes the focus detection sensor 112 from the top of the diagram, and in FIGS. 13A and 13B, strikes the focus detection sensor 112 from in front of the plane formed by the sheet of paper on which the diagram is drawn. The focus detection sensor 112 is a CMOS sensor having a one-chip-type microlens. By the operation of the microlens the focus detection light flux F-number can be set.

In FIG. 12, the reference numeral 151 designates a silicon substrate, 152A and 152B designate photoelectric conversion parts of embedded photodiodes, 154 designates a light-blocking first wiring layer made of aluminum or copper, and 155 designates a second wiring layer made of aluminum or copper. In addition, reference numeral 156 designates a passivation film and an interlayer insulation film composed of silicon oxide film, hydrophobic porous silica, silicon oxynitride film or silicon nitride film, and 158 designates a microlens. In addition, reference numeral 157 designates a flattened layer for setting the distance from the second wiring layer 155 to the microlens 158 accurately. The first wiring layer 154 and the second wiring layer 155 are metallic films with dispersed openings provided therein, and do not permit visible light to pass through areas other than these openings. The first wiring layer 154 and the second wiring layer 155 have both the electrical function of triggering the focus detection sensor 112 and the optical function of controlling the angular characteristics of the received light flux. The flattened layer 157 is formed by such techniques as spin coating a thermosetting resin or an ultraviolet setting resin and then curing the resin or by adhesion of a resin film or the like.

The photoelectric conversion parts 152A, 152B are zig-zag-shaped as shown in FIG. 13A, to the ends of which are connected circuit units 159A, 159B. The circuit units 159A, 159B have a transfer MOS transistor that functions as a transfer switch and a reset MOS transistor that supplies a reset bias voltage, and further, have a source-follower amp MOS transistor, a selection MOS transistor for selectively outputting signals from the source follower amp MOS transistor, and the like. Five microlenses 158 connected in a zigzag pattern are mounted on the photoelectric conversion part 152 (152A, 152B) as shown in FIG. 13B.

The microlens 158 is formed using resin, SiO2, TiO2, Si3N4 or the like and is used not only simply to concentrate light but also to form images, and consequently is an axially symmetrical spherical lens or an axially symmetrical non-spherical lens. Accordingly, because the microlens 158 is shaped so as to have an axis of symmetry 160 (see FIG. 12) it appears circular when viewed from above. However, by mounting multiple microlenses on each individual pixel, the photo-sensing surface area of each pixel can be increased even as the pixel pitch is decreased. Therefore, adequate focus detection output can be obtained even for low-luminance objects. Moreover, a shape like that, for example, of a Quonset hut or the like, which lacks axial symmetry, does not have an image forming effect as does a lens, and thus is not suitable for the focus detection sensor 112. It should be noted that, in order to reduce surface reflection of the light, a low-refractive index thin film or a minute structure smaller than the wavelength of visible light (a so-called sub-wavelength structure) may be formed on the surface of the microlens 158.

The light flux emitted from the splitter 103 first strikes the microlens 158 of the focus detection sensor 112, and the portion that passes through the opening 155A provided in the second wiring layer 155 and the opening 154A provided in the first wiring layer 154 then strikes the photoelectric conversion part 152A. The portion that passes through the opening 155A provided in the second wiring layer and the opening 154B provided in the first wiring layer 154 then strikes the photoelectric conversion part 152B. Each portion is then converted into an electrical signal. The first wiring layer 154 and the second wiring layer 155 are also used as the light-blocking layer for forming the openings, and thus there is no need to provide a special light-blocking layer for the openings, thereby allowing the structure of the focus detection sensor 112 to be simplified.

Figure 14:
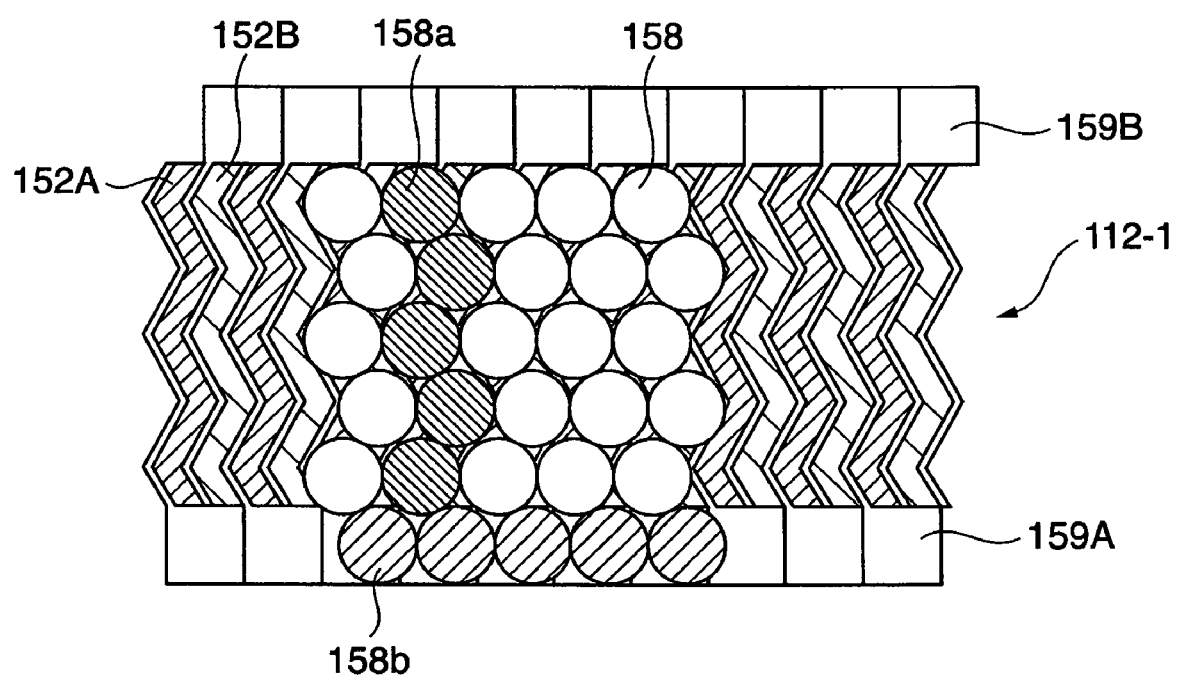
FIG. 14 is a plan view showing a state in which pixels of the image sensing element according to the first embodiment of the present invention are linked together and arranged in an array used for focus detection.
Figure 15:
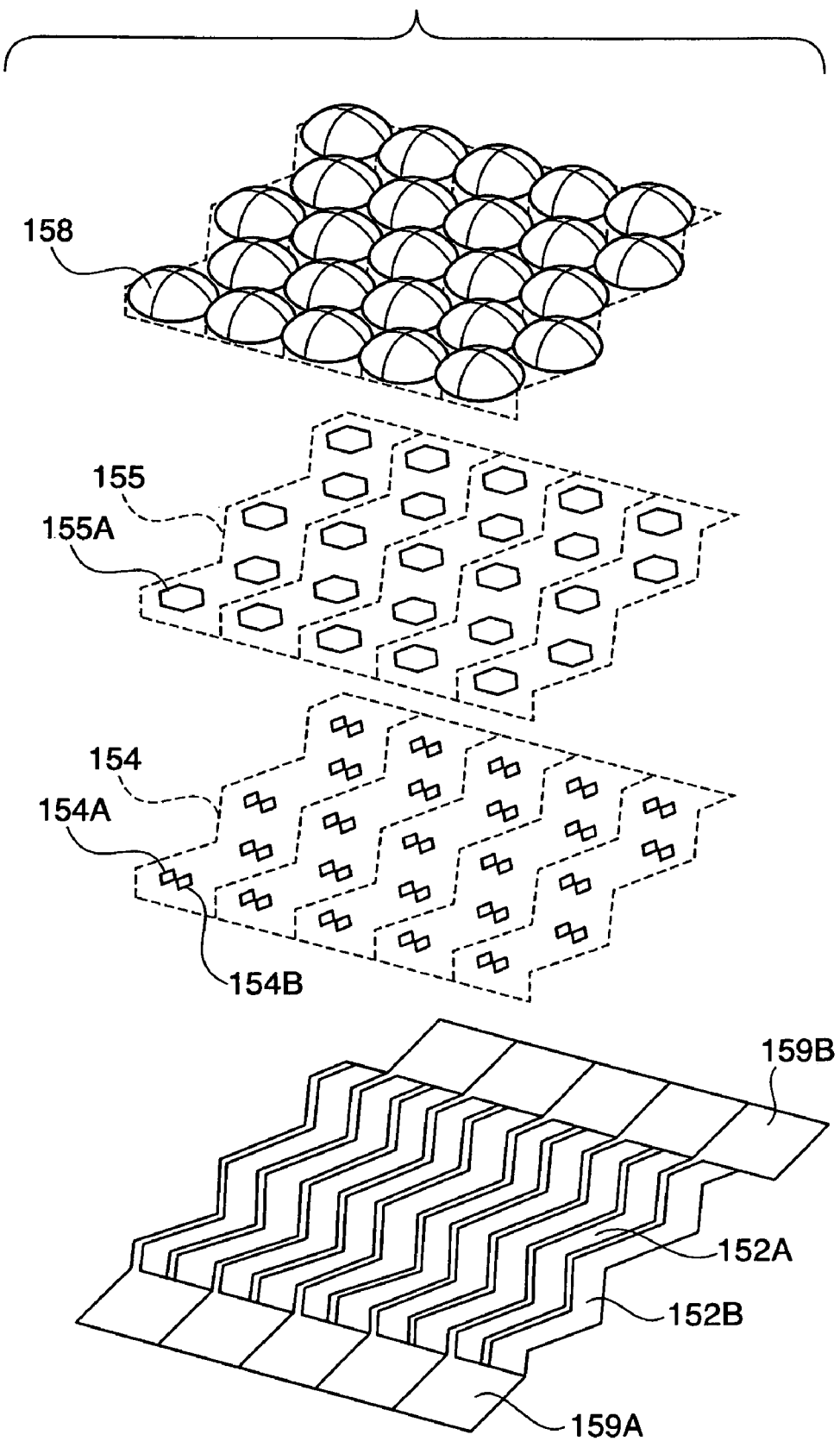
FIG. 15 is an exploded perspective view showing a state in which pixels of the image sensing element according to the first embodiment of the present invention are linked together and arranged in an array used for focus detection.

FIG. 14 and FIG. 15 show plan and perspective views, respectively, of the state of the pixel array in which the pixels shown in FIGS. 13A and 13B are linked and used for focus detection.

In FIG. 14, the microlenses 158 at both ends has been omitted so as to reveal the photoelectric conversion part in order to facilitate an understanding of the relation between the photoelectric conversion part 152 (152A, 152B) and the microlens 158. Moreover, in FIG. 15, of the constituent elements, the photoelectric conversion part 152, the first wiring layer 154, the second wiring layer 155 and the microlens 158 are extracted and shown in the form that they are exploded vertically. In order to delineate the boundaries of each individual pixel, the zigzag shape of the photoelectric conversion part is projected onto the first wiring layer and the second wiring layer and indicated by the broken line.

In FIG. 14, the five shaded microlens 158a correspond to a single pixel, and multiple such pixels are linked horizontally to form the pixel arrays 112-1 to 112-9 shown in FIG. 11. The microlenses aligned in a zigzag just cover the space between them and the microlenses of adjacent pixels, and thus the microlenses are spread tightly together atop the pixel array. Therefore, the light fluxes that do not strike the microlens and are not used are few enough that they can be virtually ignored.

In addition, when noting the direction of arrangement, the zigzag alignment allows the pixel frequency response around the Nyquist frequency to be decreased. As a result, aliasing distortion does not easily occur even with the image sensing of an object image including a high spatial frequency component equal to or greater than the Nyquist frequency, enabling high-accuracy phase difference detection between output signal waveforms of the focus detection sensor 112 that is described later to be carried out. Furthermore, around the pixel array are formed microlenses 158b, indicated by hatching, which are not disposed atop the photoelectric conversion part and which do not contribute to photoelectric conversion. These microlenses 158 are present because, for production reasons, spreading the microlenses as uniformly as possible permits precision manufacture of the microlenses 158.

Figure 16:
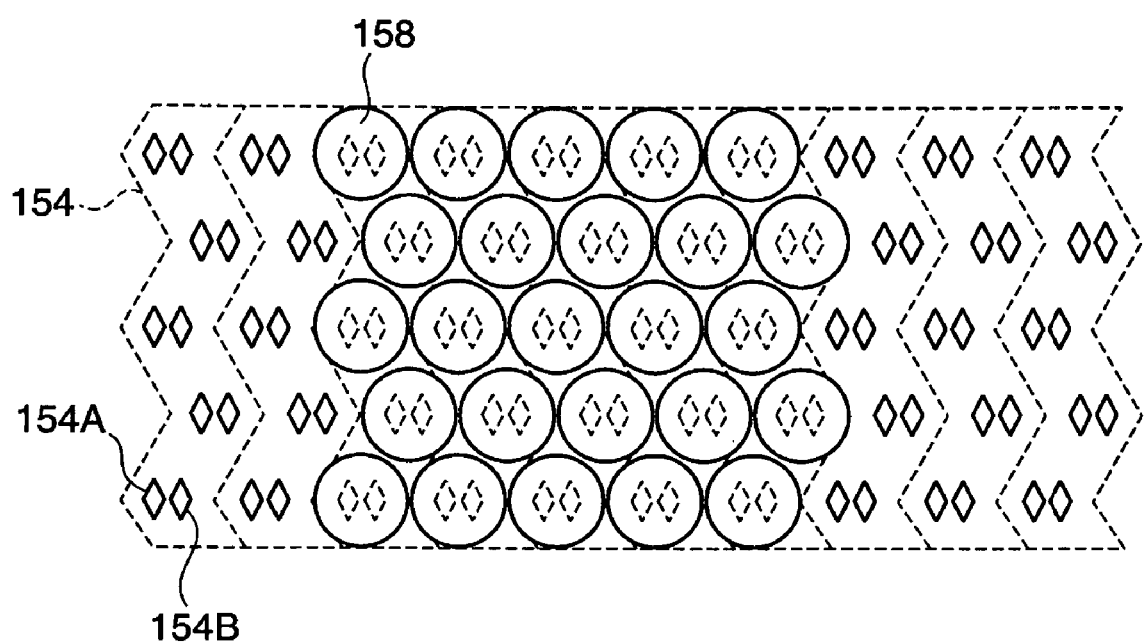
FIG. 16 is a plan view showing openings 154A, 154B of a first wiring layer 154 shown in FIG. 15.

The first wiring layer 154 shown in FIG. 15 has multiple diamond-shaped openings 154A, 154B. As shown in the plan view shown in FIG. 16, one pair of the openings 154A, 154B are provided for each microlens 158, positioned near the focus of the microlens 158 in the direction of depth. With such a structure, the openings 154A, 154B are back-projected onto the exit pupil of the image forming optical system 102 by the microlens 158, and thus it is possible to determine the photo-receiving angle characteristics of the light flux taken in by the pixel by the shape of the openings 154A, 154B. The opening 155A provided in the second wiring layer 155 is an aperture for preventing light from entering openings other than openings 154A, 154B in the first wiring layer 154. As a result, only those light fluxes which can pass through the openings 154A, 154B strike the respective photoelectric conversion part 152A, 152B. Here, in order to prevent non-uniformity in the output signal output-from the pixel arrays of the focus detection sensor 112, the shapes of the openings 154A, 154B for the pixel array that forms a single focus detection view field are constant.

Figure 17:
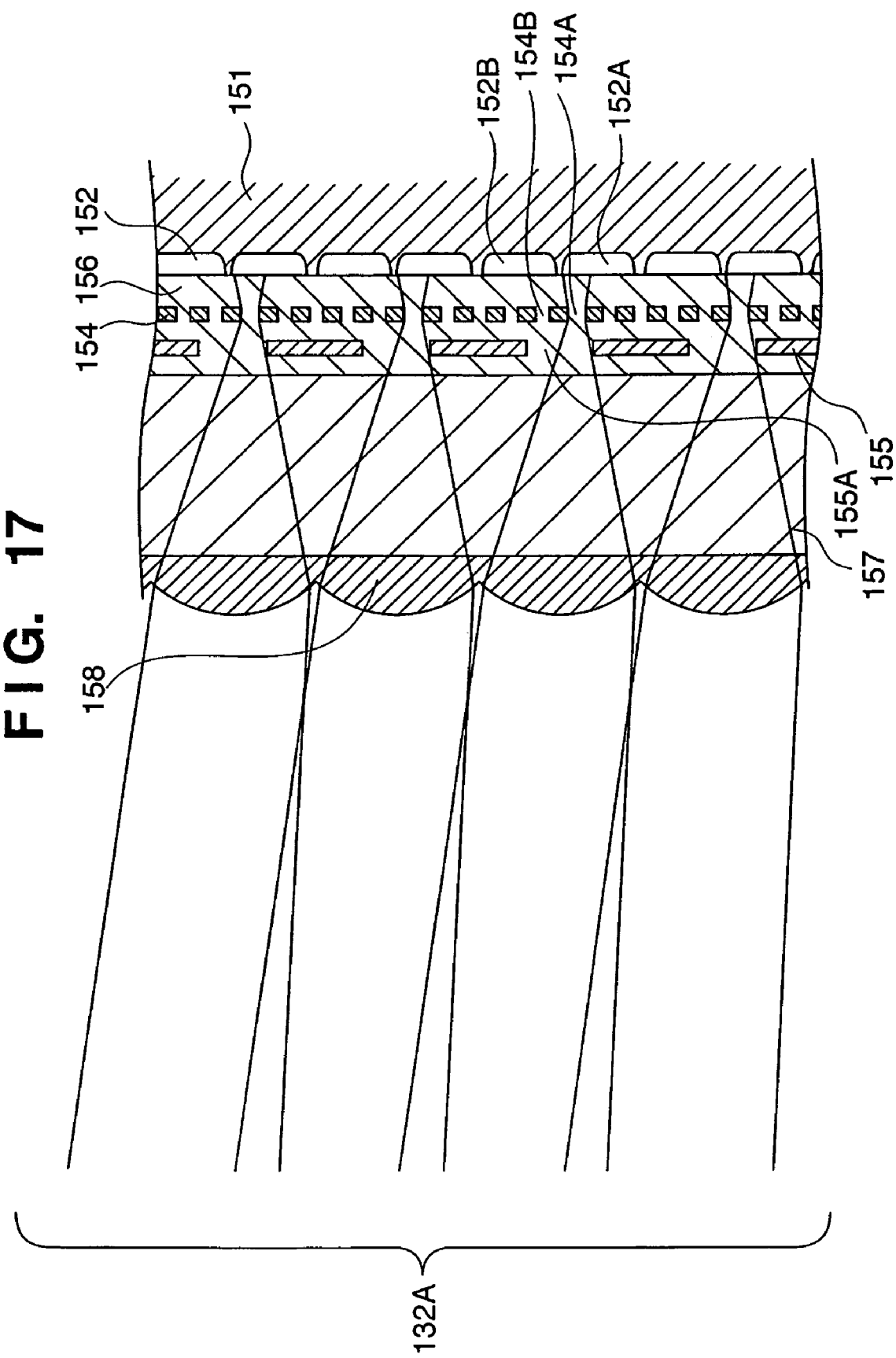
FIG. 17 is a partial sectional view of a focus detection view field 112-1 according to the first embodiment of the present invention.
Figure 18:
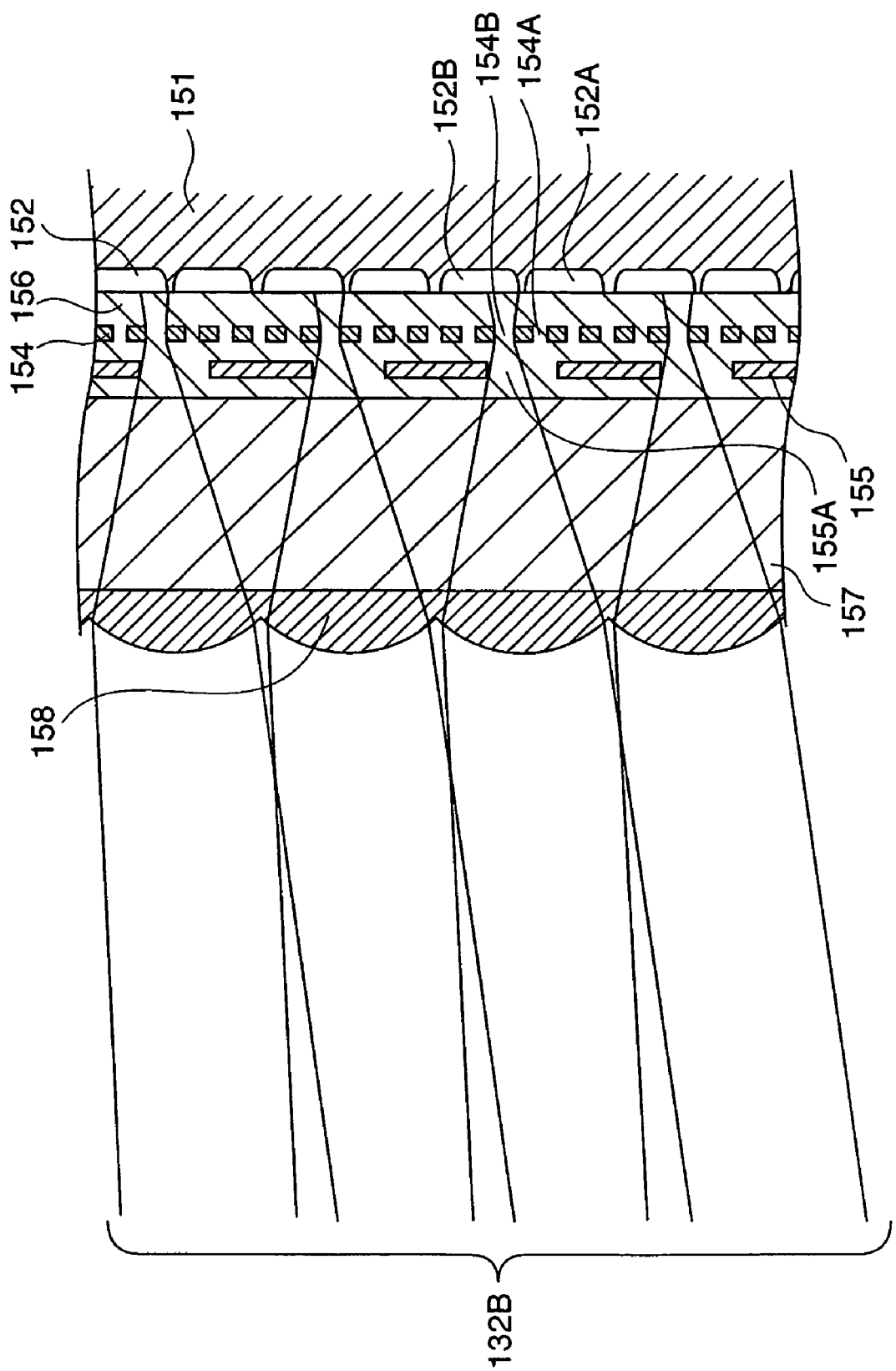
FIG. 18 is a partial sectional view of the focus detection view field 112-1 according to the first embodiment of the present invention.

FIG. 17 and FIG. 18 are partial sectional views of the focus detection view field 121-1 (pixel array 112-1) shown in FIG. 10. The microlenses 158 back-project the openings 154A, 154B in the first wiring layer 154 onto the exit pupils of the image forming optical system 102, and thus, as shown in FIG. 17, a light flux 132A is permitted to pass through the opening 154A. This arrangement is the equivalent of the light flux 132A exiting from the back-projected image of the opening 154A in the first wiring layer 154.

Similarly, as shown in FIG. 18, a light flux 132B is permitted to pass through the opening 154B. This is equivalent to the light flux 132B exiting from the back-projected image of the opening 154B in the first wiring layer 154. Therefore, light rays striking the focus detection sensor 112 from anything other than the back-projected images of the openings 154A, 154B are blocked by the first wiring layer 154 or the second wiring layer 155 and cannot reach the photoelectric conversion parts 152A, 152B, and are not photoelectrically converted. For the pixel array that forms a single focus detection view field, the following state can be observed between the output signal waveform obtained by arranging the output signals from the photoelectric conversion part 152A and the output signal waveform obtained by arranging the output signals from the photoelectric conversion part 152B: Specifically, depending on the state of focus of the object image formed by the image forming optical system 102 on the focus detection view field, a relative lateral shift is observed. This shift arises because the area through which the light flux passes on the exit pupil of the image forming optical system differs between the output signal waveform obtained by arranging the output signals from the photoelectric conversion part 152A and the output signal waveform obtained by arranging the output signals from the photoelectric conversion part 152B. Between front-focused and rear-focused the output signal waveform shift direction reverses itself, and using a technique such as correlation calculation or the like to detect this phase difference (that is, this shift amount) as well as its direction is the basic principle of focus detection.

Figure 19:
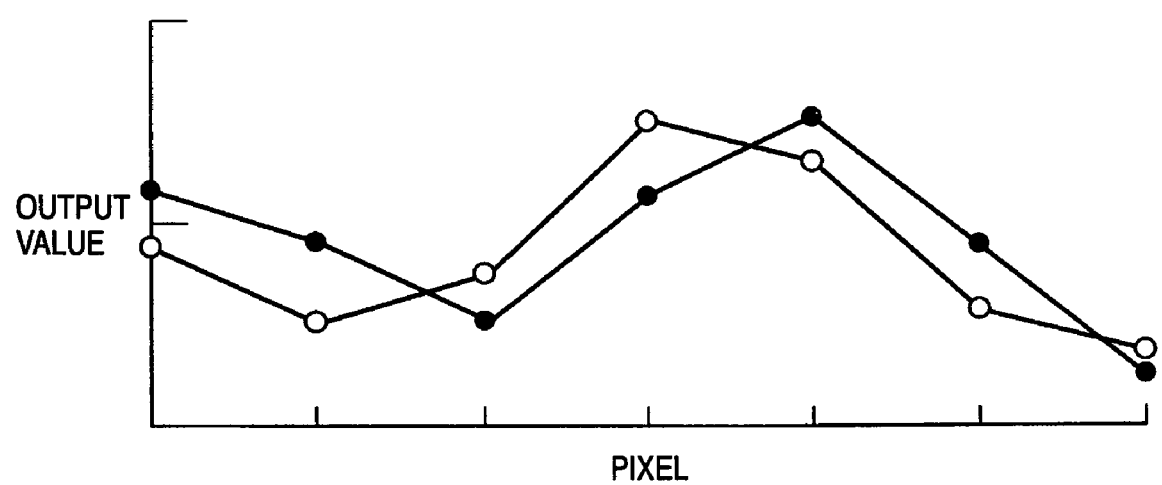
FIG. 19 is a diagram showing a focus detection sensor output signal waveform input to an AF control circuit 140 shown in FIG. 2.
Figure 20:
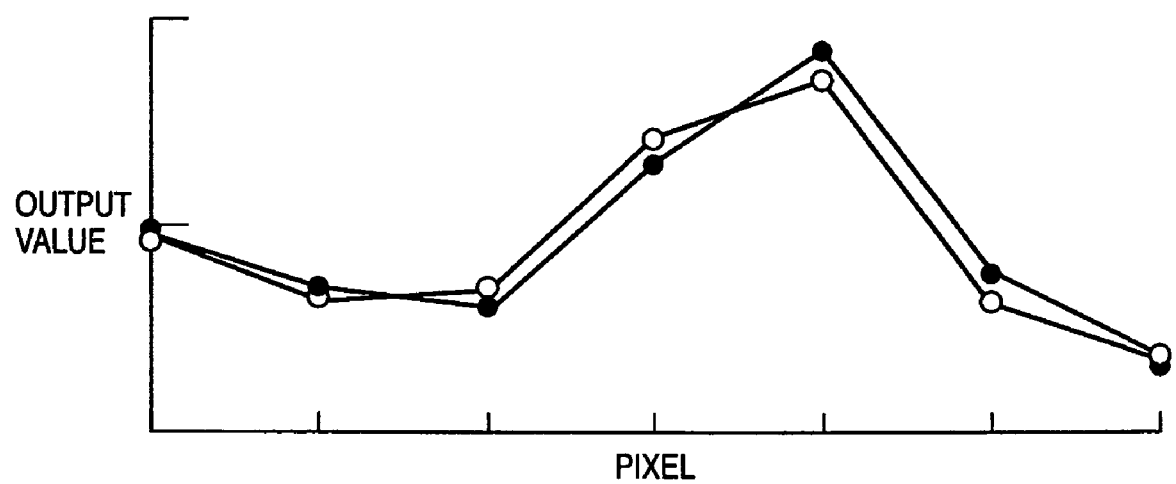
FIG. 20 is a diagram showing a focus detection sensor output signal waveform input to the AF control circuit 140 shown in FIG. 2.

FIG. 19 and FIG. 20 show output signal waveforms of the focus detection sensor 112 input to the AF control circuit 140, in which the horizontal axis represents pixel alignment and the vertical axis represents output values, respectively.

FIG. 19 shows the output signal waveforms in a state in which the object image is out of focus and FIG. 20 shows the output signal waveforms in a state in which the object image is in focus. Thus, first, by judging the identity (similarity) of a set of signals, focus detection can be carried out. Furthermore, by using a well-known technique employing correlation calculation, for example, the technique disclosed in Japanese Laid-Open Patent Application Publication No. 05-088445 to detect a phase difference, the amount of defocus can be obtained. Converting the defocus amount so obtained into the amount the focusing lens 102a of the image forming optical system 102 should be driven makes automatic focusing control possible. Since the amount the focusing lens 102a should be driven is known in advance, the driving of the lens to the focus position is normally accomplished in essentially one drive operation, thus providing high-speed focusing control.

Here, a description is given of the focus detection light flux. The focus detection sensor 112 varies the F-number of the focus detection light flux with each focus detection view field by controlling the photo-receiving angle characteristics with each focus detection view field. The size of the area through which the light flux passes on the exit pupil of the image forming optical system is large in the center focus detection view field 121-1 and small in the periphery focus detection view field 121-4.

Figure 21:
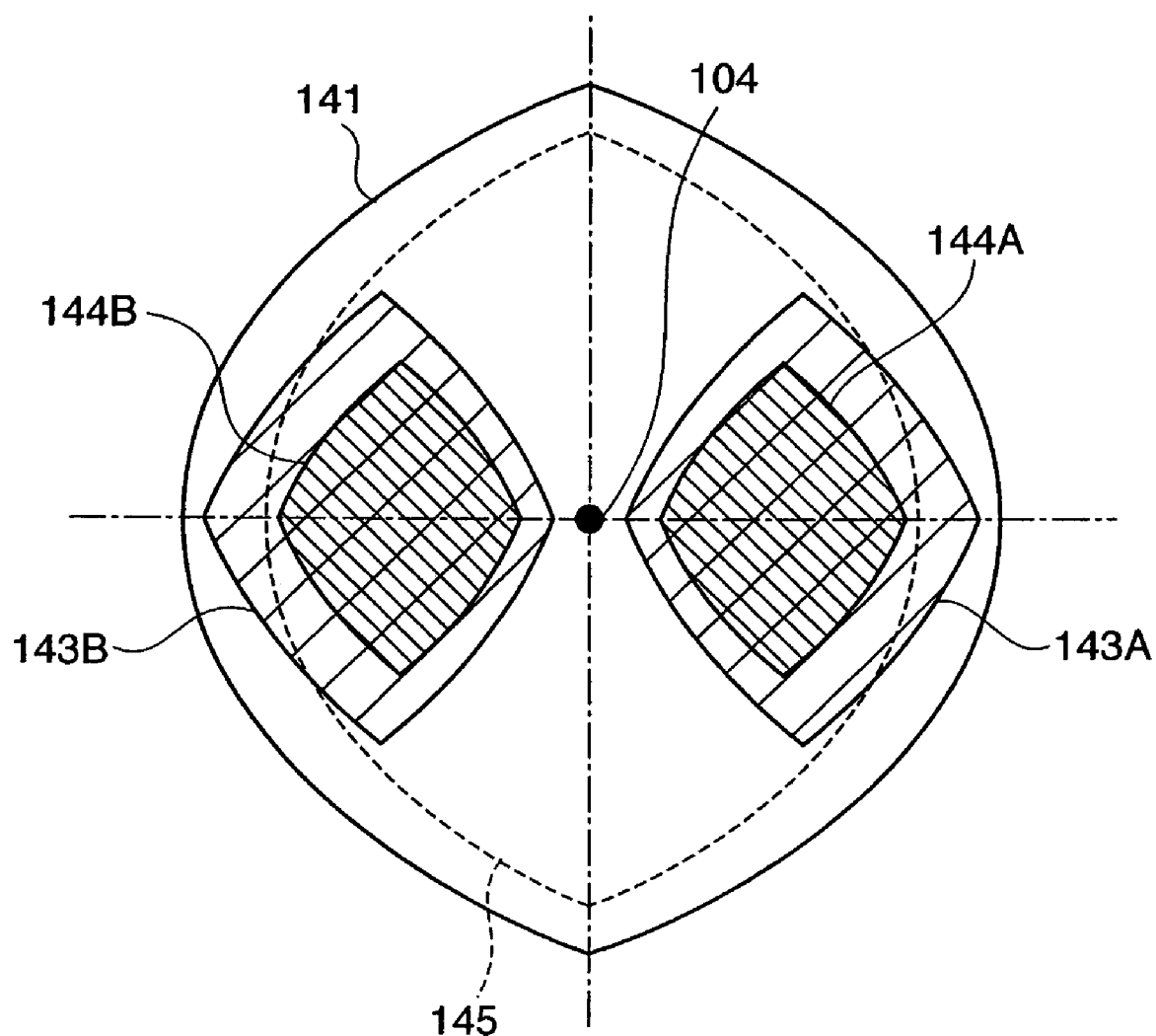
FIG. 21 is a diagram illustrating a transit area of a focus detection light flux on an exit pupil of an image forming optical system 102 shown in FIG. 1.

FIG. 21 illustrates the area through which the focus detection light flux passes on the exit pupil of the image forming optical system 102. A pupil area 141 shows a vignetting of the aperture of the image forming optical system 102 when seen from the edge of the focus detection view field 121-1, and a pupil area 145 shows a vignetting of the aperture of the image forming optical system 102 when seen from the edge of the focus detection view fields 121-4, 121-5, 121-6 and 121-7. By contrast, pass-through areas 143A, 143B of the focus detection light flux of the focus detection view field 121-1 are located inside the pupil area 141, and pass-through areas 144A, 144B of the focus detection light flux of the focus detection view field 121-4 are located inside the pupil area 145.

The broader the pass-through area of the focus detection light flux the greater the amount of light striking the photo-sensor, and focus detection of even low-luminance objects can be carried out accurately. In terms of efficient utilization of the light from the object, in this structure the actual area through which the focus detection view field flux passes is also large in the focus detection view field 112-1 of the screen center in which the pupil area as a characteristic of the image forming optical system 102 is large. At the same time, in the focus detection view field 121-4 of the screen periphery, in which the pupil area as a characteristic of the image forming optical system 102 is narrow and often vignetted, the actual area through which the focus detection light flux passes is also narrow. Therefore, it can be understood that the two requirements concerning the amount of light at the center of the screen and the positioning of the focus detection view field at the periphery of the screen are neatly satisfied and the light from the object is used very efficiently.

Figure 22:
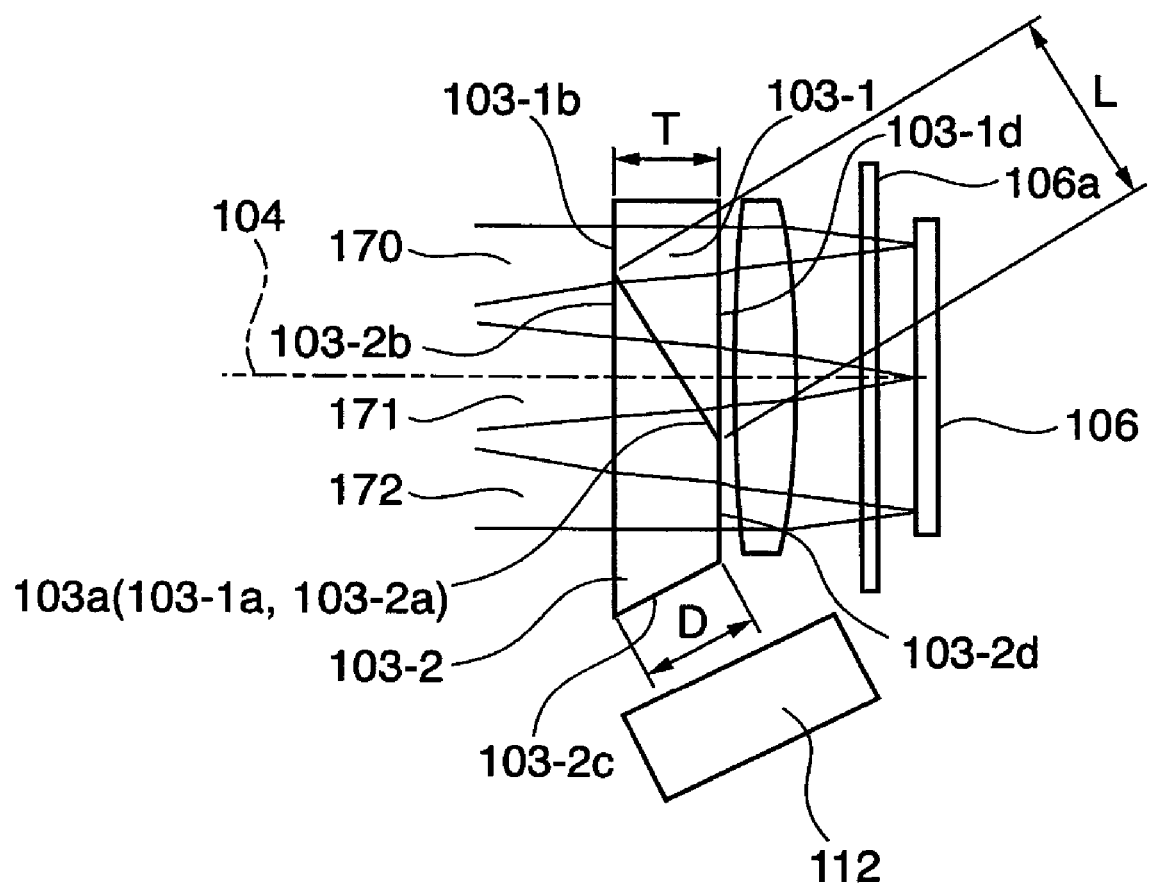
FIG. 22 is a diagram illustrating an image sensing light flux according to the first embodiment of the present invention.

Next, a description is given of the area through which the focus detection light flux passes on the splitter 103. FIG. 22 shows a sectional view of the splitter 103 and its vicinity depicting the focus detection light flux.

In FIG. 22, reference numeral 170 designates a focus detection light flux heading toward the focus detection view field 121-3 of the focus detection sensor 112, 171 designates a focus detection light flux heading toward the focus detection view field 121-1 and 172 designates a focus detection light flux heading toward the focus detection view field 121-2. After the focus detection light fluxes 170, 171, 172 are reflected by the light splitting surface 103a, at surface 103-2b the focus detection light fluxes 170, 171, 172 are fully reflected by the difference in refractive index between the air and the prism 103-2 and exited from the surface 103-2c. In the cross-section shown in FIG. 22, the focus detection light fluxes 170 and 172 pass through the outermost areas of all the focus detection light fluxes, and thus it is sufficient to note the focus detection light fluxes 170 and 172 in deciding the size of the effective ranges of the surfaces.

The splitter 103 is a part of the image forming optical system 102, and therefore making the splitter 103 construction as thin as possible facilitates making the entire image forming optical system 102 compact. Particularly in a case in which the image forming optical system 102 is retracted into the body of the camera, the longer the space between optical surfaces of the image forming optical system 102 the shorter the length when stored. In order to make the thickness T of the splitter 103 as small as possible, the length L of the light splitting surface 103a and the depth D of the surface 103-2c are to be set to values by adding manufacturing tolerance to the smallest value that permits the focus detection light fluxes to pass.

By setting the light splitting surface 103a small so that only light flux in the area of the focus detection view field enters the light splitting surface 103a, light flux outside the focus detection view field does not strike the light splitting surface 103a.

Figure 23:
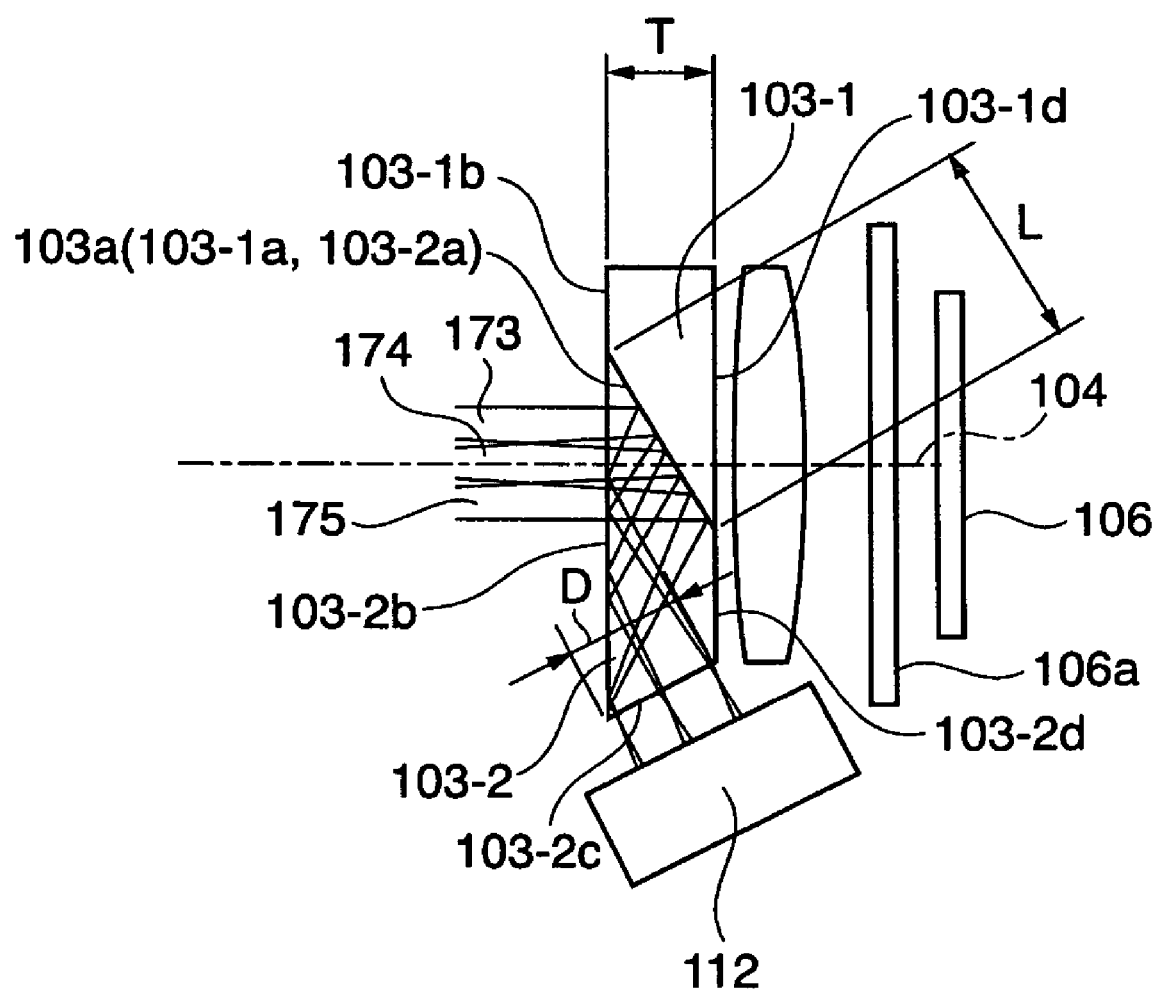
FIG. 23 is a sectional view of a splitter part drawn on a focus detection light flux according to the first embodiment of the present invention.

FIG. 23 illustrates an image sensing light flux. In FIG. 23, reference numeral 173 designates an image sensing light flux striking the upper area of the image sensing element 106, 174 designates an image sensing light flux striking the central area of the image sensing element 106, and 175 designates an image sensing light flux striking the lower area of the image sensing element 106. The image sensing light flux 174 passes through the light splitting surface 103a, and thus the light on the exit pupil side of the splitter 103 acquires an intensity distribution that is the product of the spectral transmittance characteristics at the light splitting surface 103a multiplied by the spectral intensity characteristics of the object.

Figure 25:
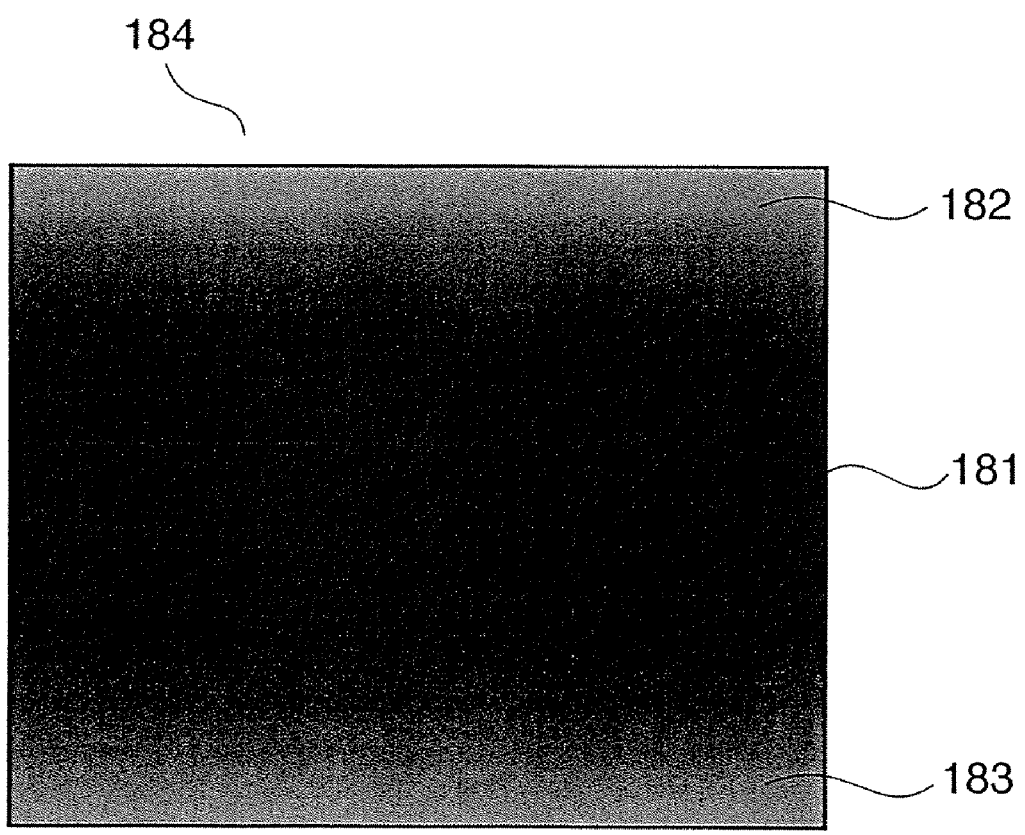
FIG. 25 is a diagram showing unevenness in luminance of an image in the first embodiment of the present invention.

The image sensing light fluxes 170 and 172 pass through, respectively, surface 103-1b of prism 103-1 and surface 103-2d of prism 103-2, on which surfaces are formed the ND filter. Consequently, the light flux exited from the splitter 103 has an intensity distribution that is the product of the spectral transmittance characteristics of the ND filter described above using FIG. 9 multiplied by the spectral intensity characteristics of the object. In the visible wavelength range there is virtually no difference between the spectral transmittance characteristics of the light splitting surface 103a, surface 103-1b and surface 103-2b, and therefore an image 180 of uniform brightness as shown in FIG. 24 is obtained when image sensing an optical image of uniform luminance surface using the image sensing element 106. With no special luminance unevenness arising as a result, the upshot is image sensing results that are not in any way different from ordinary images. If no ND filter were formed on surface 103-1b of prism 103-1 and on surface 103-2d of prism 103-2, and permittivity is almost 100 percent. In that case, the image of the object sensed by the image sensing element 106 would be an image 184 shown in FIG. 25, with a central dark area 181 sandwiched top and bottom by bright areas 182 and 183. Thus, the effect of adjusting the permittivity using an ND filter can be said to be very large.

Figure 26A:
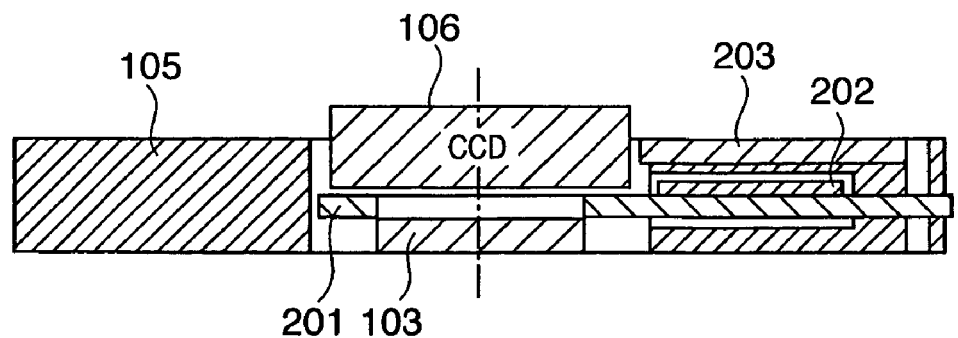
FIGS. 26A and 26B are structural diagrams showing side and front views, respectively, of a case in which the splitter and its holding member according to the first embodiment of the present invention are at the effective position.
Figure 26B:
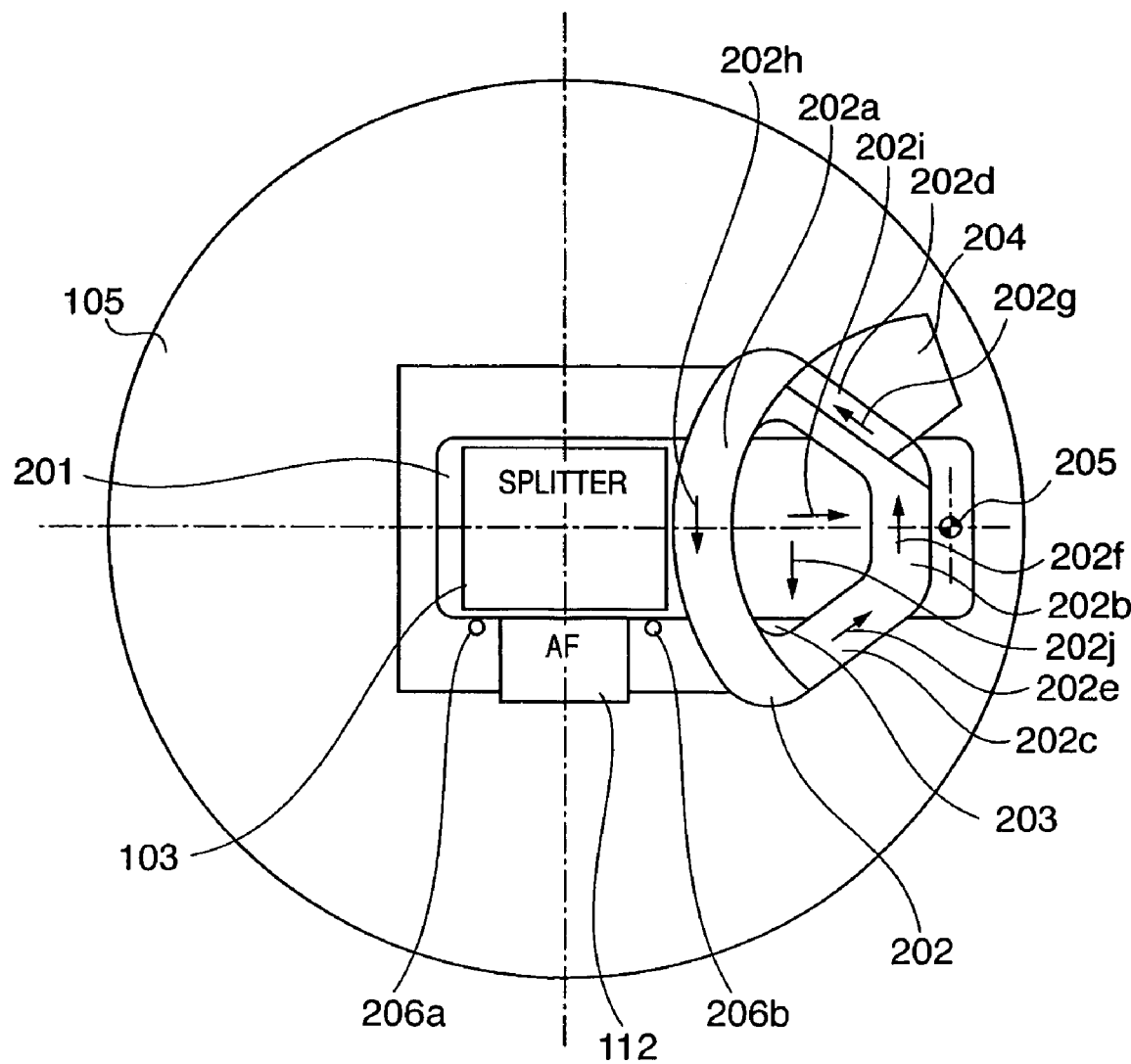

FIG. 26A and FIG. 26B are sectional and front views, respectively, of a case in which an AF module containing the splitter 103 which is a light flux splitting means and the focus detection sensor 112 is disposed in the lens barrel 105.

In FIGS. 26A and 26B, an arm 201 that holds the splitter 103 is rotatably supported with respect to a fixed part of the lens barrel 105 by a shaft 205 about which the arm 201 rotates. The rear surface of the splitter 103 of the arm 201 is hollowed out, and the image sensing light flux passes through the splitter 103 from the object image and the image sensing lens and an image is formed on the image sensing element 106. A drive coil 202 is fixed on the arm 201. When an electric current is applied to the drive coil 202, a primary magnet 203 and a secondary magnet 204 fixed on the lens barrel 105 side causes the arm 201 to revolve about the shaft 205. The arm 201, the coil 202, the primary magnet 203, the secondary magnet 204 and the shaft 205 together comprise holding means for the light splitting means including the splitter 103.

Stoppers 206a, 206b are positioning pins for when the arm 201 comes to the position shown in FIG. 26B, and by pressing the arm 201 against the stoppers 206a, 206b by an impelling force of the drive coil 202 the positioning accuracy of the arm 201 is increased. In this position (the effective position), the splitter 103 directs the image sensing light flux to both the focus detection sensor 112 and the image sensing element 106. When the arm 201 is in the position shown in FIG. 26B, as can be understood from the side view shown in FIG. 23 the focus detection sensor 112 is disposed opposite an end surface of the arm 201.

Figure 27:
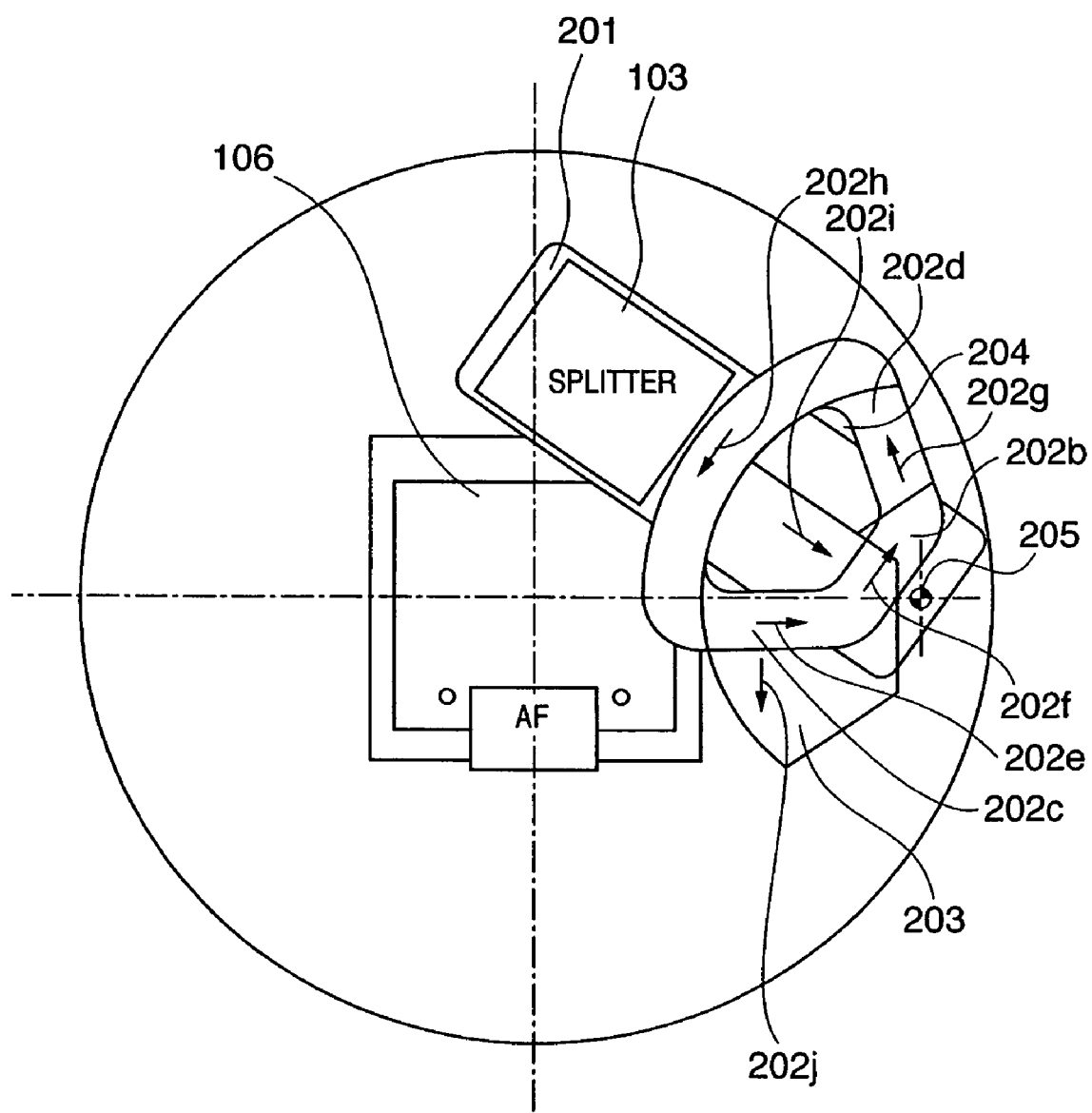
FIG. 27 shows a front view of a case in which the splitter and its holding member according to the first embodiment of the present invention are at the retracted position.

A description is now given of the primary magnet 203 and the secondary magnet 204. FIG. 27 shows the arm 201 in a state of retraction from the light path (that is, the retracted position), in which the primary magnet 203 is magnetized in the direction of its thickness so that the North magnetic pole is formed in the direction projecting from the drawing, and the secondary magnet is magnetized in the direction of its thickness so that the North magnetic pole is formed in he direction sinking to the drawing.

When an electric current is applied to the drive coil 202, an electric current flows through the drive coil 202 in directions indicated by arrows 202e, 202f, 202g and 202h. At this time, the direction of the electric current in coil part 202c (indicated by arrow 202e) and the direction of the magnetic flux of the primary magnet 203 subjects the coil part 202c to a force in a direction indicated by arrow 202j with respect to the primary magnet 203. In addition, the direction of the electric current in coil part 202d (indicated by arrow 202g) is the reverse of the direction of the electric current indicated by arrow 202e, but because the direction of the magnetic flux of the secondary magnet 204 is the reverse of the direction of magnetic flux of the primary magnet 203 the coil part 202d is subjected to the force exerted in the direction indicated by arrow 202j with respect to the secondary magnet 204. As a result, the arm 201 rotates counterclockwise about the shaft 205. At this point in time there is a slight chatter between the arm 201 and the shaft 205, which can result in drive accuracy deterioration. However, in FIG. 27, a combination of the direction of the electric current in a coil part 202b (indicated by arrow 202f) and the direction of the magnetic flux of the primary magnet 203 subjects the arm 201 to an impelling force in the direction indicated by arrow 202i as well, which serves the function of reducing the chatter between the arm 201 and the shaft 205. Thus, as described above, the splitter 103 moves from the retracted position shown in FIG. 27 to the effective position shown in FIGS. 26A and 26B with little chatter.

If electric current continues to be applied to the drive coil 202 even after the splitter 103 reaches the effective position shown in FIGS. 26A and 26B, then the arm 201 is subjected to force in the direction indicated by arrow 202j but is restricted by the stoppers 206a, 206b and thus stops accurately at that position. In addition, the coil part 202b also is positioned inside the primary magnet 203, and thus the arm 201 is also subjected to the force exerted in the direction indicated by arrow 202i, which suppresses (by pressing aside) the chatter between the shaft 205 and the arm 201. Furthermore, if the splitter 103 is at the effective position, a portion of the coil part 202d is positioned inside the primary magnet 203, and as a result the entire drive coil 202 is subjected to a force in a normal direction of the drawing with respect to the primary magnet 203, which in turn presses aside chatter in this direction as well so as to enable high-accuracy positioning.

When one wishes to return the splitter 103 to the retracted position, an electric current in the reverse direction is applied to the drive coil 202, by which the relative positions of the coil part 202c and the primary magnet 203, as well as the relative positions of a portion of the coil part 202d and the secondary magnet 204, subject the arm 201 to the force exerted in the direction opposite to arrow 202j (the arm 201 is also subjected to a force in the direction opposite the direction indicated by arrow 202i). As a result, the arm 201 starts to rotate clockwise about the shaft 205 and the splitter 103 returns to the retracted position.

Figure 28:
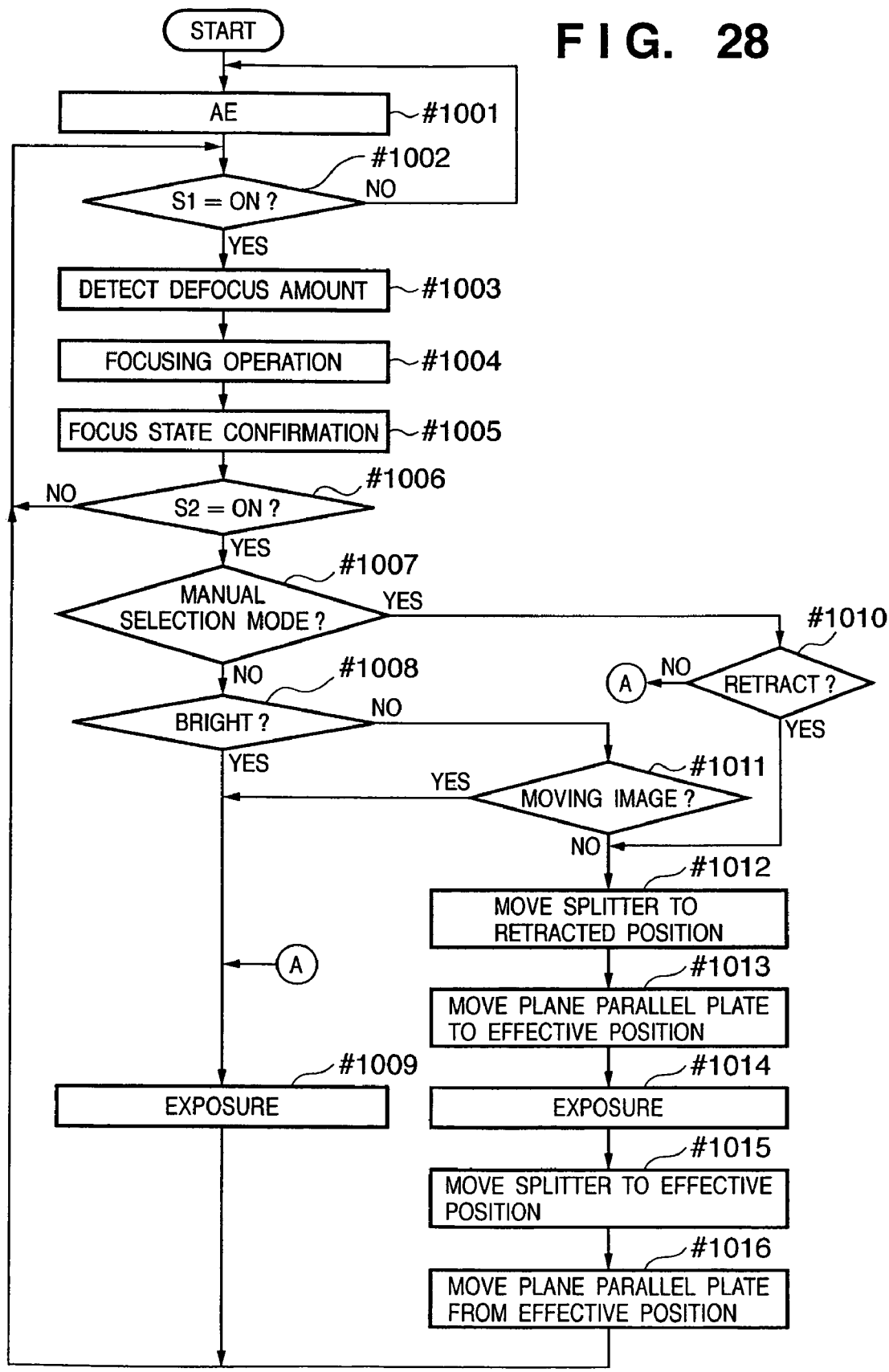
FIG. 28 is a flow chart illustrating the processes performed by the image sensing apparatus according to the splitter of the first embodiment of the present invention.

FIG. 28 is a flow chart illustrating the operation of the mechanism shown in FIGS. 26A, 26B and 27 through an image sensing sequence of a camera. This sequence of operations starts when the camera power is turned on and ends when the power is turned off. It should be noted that, to avoid complication, descriptions of the operations of elements not directly related to the present invention and the detailed operation of each step (for example, confirmation after an operation or a standby operation with a timer) are omitted.

In step #1001, the image sensing element 106 is driven, object image information is collected, a variety of processes are carried out on the object image information with the RGB image processing circuit 131 and the YC processing circuit 132, and the processed object image information is output to the display device 107 so that the object image can be checked on the display device 107. In addition, during this series of processes the brightness of the object image is obtained, and depending on that brightness, the diaphragm inside the lens barrel 105 is adjusted and signals output from the image sensing element 106 are boosted so as to enable an object image of appropriate brightness to be displayed on the display device 107. Furthermore, this brightness information is used in step #1008 to determine the necessity of retracting the splitter 103.

Next, in step #1002, the cycling of step #1001 continues in a standby mode until the shutter release button 111 is pressed halfway (hereinafter described as S1). When pressed halfway (S1=ON), processing proceeds to step #1003. Then, in step #1003, charge corresponding to a light flux striking the focus detection sensor 112 through the splitter 103 is accumulated and detection of the defocus amount (detection of the focus state) is carried out. Thus, the splitter 103 normally is positioned within the optical path of the image sensing lens (the effective position shown in FIGS. 26A and 26B).

Next, in step #1004, in accordance with the focus detection results, part or all of the image forming optical system 102 is driven and the object image is focused on the surface of the image sensing element 106. Then, in the next step #1005, charge corresponding to the light flux striking the focus detection sensor 112 is again accumulated and the defocus amount is detected to confirm that the image is in focus. Although omitted from this sequence, if it is determined here that the focus is inadequate, then, based on that result, the image forming optical system 102 is again driven to correct the focus and the focus confirmation operation is repeated. If after multiple iterations of the operations described above the image is still out of focus, then a message indicating that the camera cannot focus is displayed, focusing operation is stopped and processing proceeds to step #1006.

In step #1006, it is determined whether or not the shutter release button 111 has been fully depressed (hereinafter described as S2) (S2=ON). If it is determined that it is not S2=ON, then processing returns to step #1002. By contrast, if it is determined that S2=ON, then processing proceeds to step #1007. It should be noted that, although in the sequence shown in FIG. 28 processing does not proceed to step #1006 if the operations of steps #1003 to #1005 do not end, the present invention is not limited to such an arrangement, and thus, alternatively, processing may proceed to step #1006 even if focusing is not finished. In other words, processing may proceed to exposure by fully depressing the release button even in an out-of-focus state.

In step #1007, it is determined whether or not the camera is in a manual selection mode, in which, depending on the photographer's preference, the splitter 103 is to be positioned in the light path (the effective position shown in FIGS. 26A and 26B) or retracted from the light path. Thereafter, processing proceeds to step #1010 in the selection mode that enables selection by the photographer or to step #1008 in an automatic selection mode.

When proceeding from step #1007 to step #1008 in the automatic selection mode, it is determined whether or not to retract the splitter 103 from the light path during exposure based on the brightness of the object image obtained in step #1001 described above. The splitter 103 itself, as described above, decreases the amount of light that strikes the image sensing element 106. Therefore, in the case where an object to be sensed is bright which is typical of ordinary image sensing, the splitter 103 may be positioned (held) in the light path at the effective position without adverse effect, but in the case where an object to be sensed is dark, the splitter 103 is driven to the retracted position so that an adequate amount of light from the object strikes the image sensing element 106.

Newer image sensing elements are more sensitive, and therefore there is no need to retract the splitter 103 if the object is slightly dark. Conversely, precisely because the image sensing elements are so sensitive, instances in which the object is so bright that the image sensing diaphragm must be contracted are increasingly common. In such cases as these as well, the amount of light can be attenuated by the splitter 103. Accordingly, there is no need to contract the image sensing diaphragm, and thus the effects of diffraction and the deepening of the depth of field that are caused by contracting the diaphragm can be avoided. Among digital cameras are some types that cope with a bright object by adjusting the amount of light by inserting an ND filter in the light path, but for the digital camera according to the present invention an ND filter is not needed. Furthermore, because there is no need to retract the splitter 103 during exposure, the image sensing release time lag can be shortened. If the light amount attenuation due to the holding of the splitter 103 at the effective position is great, the image sensing diaphragm can be expanded or the exposure time can be lengthened. Thus, as described above, it becomes possible to carry out image sensing without retracting the splitter 103 as with ordinary image sensing, making it possible to smoothly shift from an image sensing preparatory state to an image sensing state.

By contrast, if the object is extremely dark and the diaphragm is widened to its maximum extent during image sensing or the exposure time is lengthened to the point where hand-shake is risked, then the splitter 103 is retracted so that an adequate amount of light is directed to the image sensing element 106 and noise is reduced.

In step #1008 noted above, processing proceeds either to step #1011 if it is determined that it would be better to retract the splitter 103 to the retracted position or to step #1009 if the splitter 103 may be left at the effective position. It should be noted that, in step #1008, specifically the brightness of the object image acquired in step #1001 is compared to a preset threshold value, and processing proceeds either to step #1009 if the brightness of the object is greater than the threshold value or to step #1011 if the brightness of the object is less than the threshold value. The threshold value is set at the time the camera is shipped from the factory and is based generally on the sensitivity of the image sensing element 106, the permittivity of the splitter 103 and so forth. Of course, alternatively, the camera may be configured so that the threshold value is changeable according to user preference.

In step #1009, the exposure operation is carried out in a state in which the splitter 103 is positioned at the effective position in the light path. The exposure operation resets the charge accumulated in the image sensing element 106, and, after the lapse of a charge accumulation time that varies depending on the brightness of the object, shields the image sensing element 106 from light with a shutter or the like and reads out the accumulated charge. In addition, the read-out image sensing data is simultaneously recorded on a recording medium at this time. When exposure ends, although not shown in this sequence, if the shutter release button 111 continues to be pressed (S1, S2=ON), the camera enters a standby mode in step #1009, during which time the sensed image continues to be displayed on the display device 107. When the shutter release button 111 is released, the shutter is once again opened and processing returns to step #1002.

In step #1008 described above, when the object is dark and it is determined that it would be better that the splitter 103 be retracted during exposure, processing proceeds to step #1011 as described above, in which it is determined whether the image sensing operation is still-image image sensing or moving-image image sensing. If the results of the determination indicate that the image sensing involves still-image image sensing, processing proceeds to step #1012 and the succeeding processes, in which the splitter 103 is retracted. However, if the results indicate the image sensing involves moving-image image sensing, then processing proceeds to step #1009 to carry out moving image recording without retracting the splitter 103. In the latter case, the splitter 103 is not retracted because in the case of moving images it is necessary to carry out focus detection and focusing during moving image recording.

In the case of still-image image sensing, when proceeding from step #1011 to step #1012, the splitter 103 is moved to the retracted position shown in FIG. 27. Then, in the succeeding step #1013, the plane parallel plate 114 is inserted into the image sensing light flux to compensate for a change in light path length created by the retraction of the splitter 103. In the succeeding step #1014 an exposure operation is carried out as in step #1009. Then, after exposure ends, although not shown in this sequence, if the shutter release button 111 continues to be pressed (S1, S2=ON), the camera enters a standby mode in step #1014, during which time the sensed image continues to be displayed on the display device 107. When the shutter release button 111 is released, the shutter is once again opened and processing proceeds to step #1015.

In the succeeding step #1015, the splitter 103 is moved to the effective position shown in FIGS. 26A and 26B. Then, in the succeeding step #1016, the plane parallel plate 114 is driven to its original position which was inserted to the light path in order to compensate for a change in focus of the image forming optical system 102 caused by the insertion of the splitter 103, and processing returns to step #1002.

In addition, where processing proceeds to step #1010 in the selection mode in which the user selects the position of the splitter 103, it is determined if the splitter 103 is selected to be positioned at the effective position or to be positioned at the retracted position. Where the effective position is selected, processing proceeds to step #1009 for exposure. By contrast, where the retracted position is selected, processing proceeds to step #1012 and the splitter 103 is retracted. Here, if the retracted position is selected, the camera is constructed so that, in accordance with the user's selection, the splitter 103 is positioned at the retracted position regardless of whether the image to be sensed is a still image or a moving image.

Thus, as described above, it is possible to select whether to position the splitter 103 in the light path during image sensing or to retract it from the light path during image sensing. As a result, even in an instance in which the object is bright and conventionally the image sensing diaphragm must be contracted, the attenuation of the amount of light by the splitter 103 eliminates the need to contract the image sensing diaphragm, and thus the effects of diffraction and the deepening of the depth of field that are caused by contracting the diaphragm can be avoided. In addition, when the object is dark, an adequate amount of light can still be directed to the image sensing element 106 by retracting the splitter 103.

With the structure described above, the effects of diffraction and the change in the depth of field that are caused by contracting the diaphragm can be avoided using a simple structure, and can obviate the need for an ND filter or other such mechanism. Moreover, the release time lag during image sensing can also be shortened.

Second Embodiment

Figure 29:
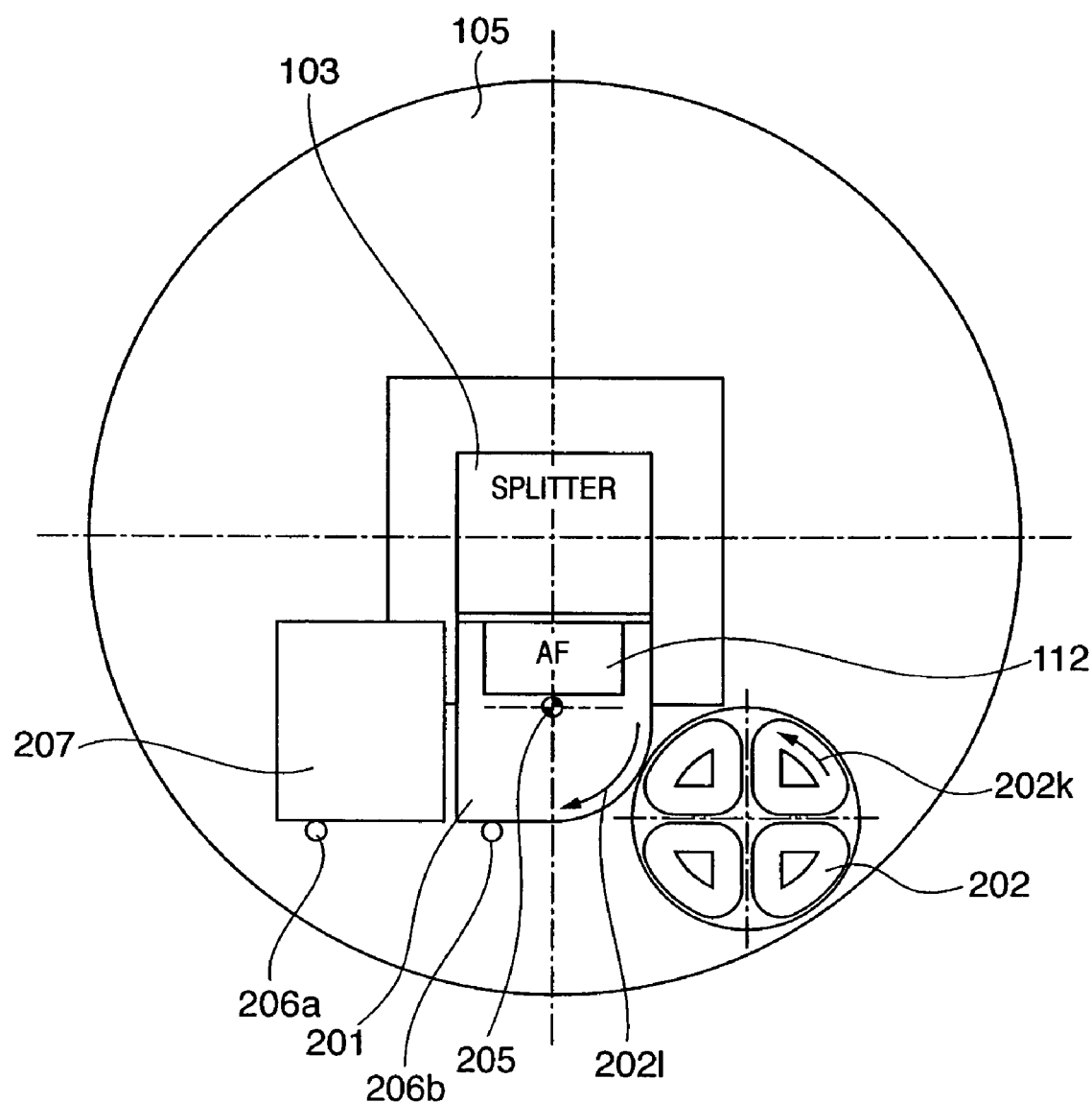
FIG. 29 is a structural diagram showing a front view in a case in which the splitter and its holding member according to a second embodiment of the present invention are at the effective position.
Figure 30:
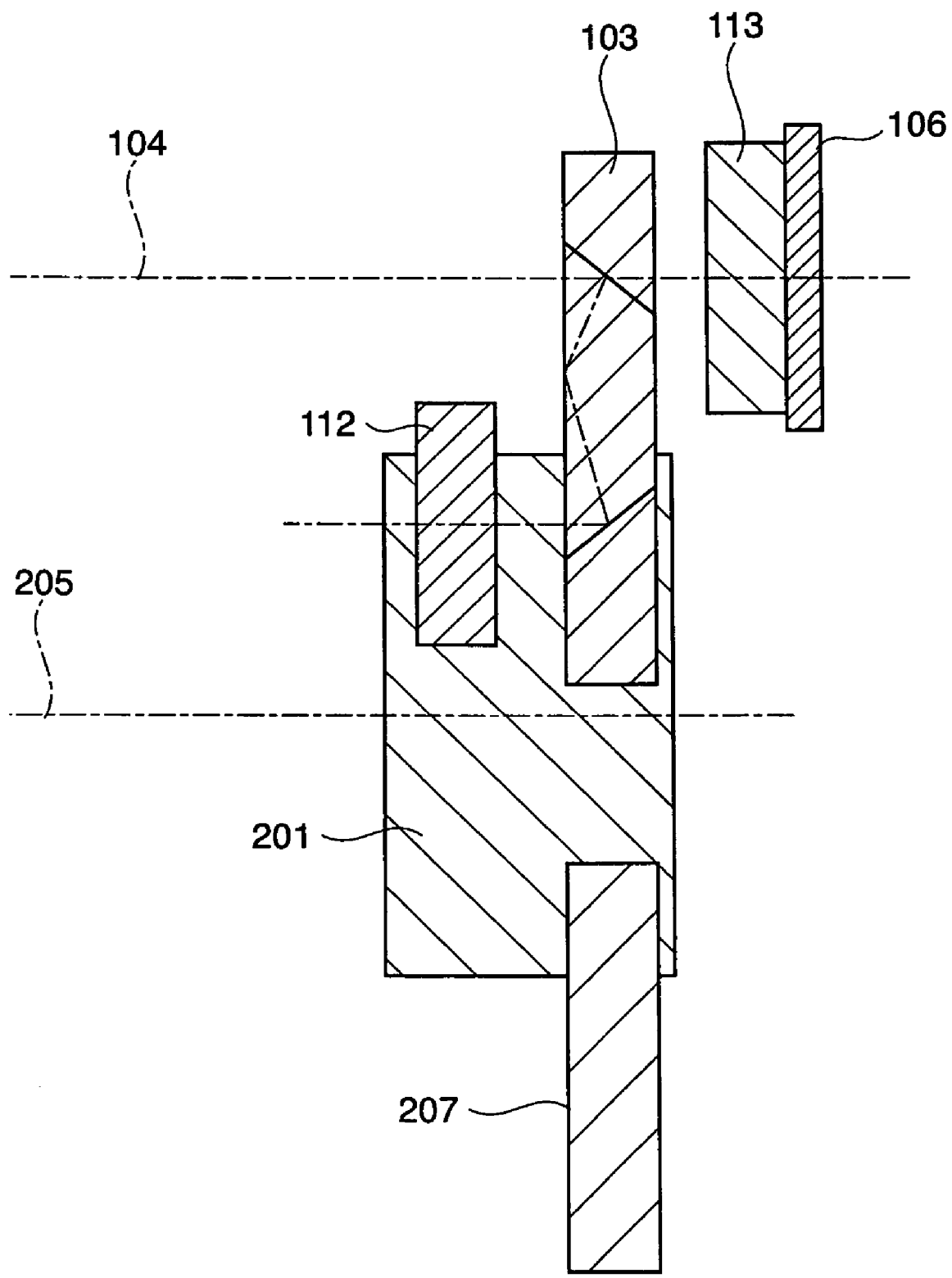
FIG. 30 is a structural diagram showing a side view of the splitter and its holding member shown in FIG. 29.

FIG. 29 shows a front view of the structure of a light splitting means including the splitter 103 and its holding means installed in a digital camera according to a second embodiment of the present invention, in which parts having the same functions as in the first embodiment shown in FIGS. 26A and 26B are designated by the same reference numerals. In addition, FIG. 30 is a sectional view showing only the significant parts in order to facilitate an understanding of FIG. 29. The rest of the structure of the digital camera is the same as that of the first embodiment.

In the second embodiment of the present invention, the structural differences with the first embodiment described above are the following two points: That is, the focus detection sensor 112 is constructed so as to rotate with the splitter 103 as a single unit, and moreover, a focus correction transparent panel 207 also rotates as a single unit with the splitter 103 and is positioned in the light path after retraction of the splitter 103.

In FIG. 29, the arm 201 that holds the splitter 103 is rotatably supported with respect to a fixed part of the lens barrel 105 by a shaft 205 about which the arm 201 rotates. The rear surface of the splitter 103 of the arm 201 is hollowed out, and the image sensing light flux passes through the splitter 103 from the object and the image sensing lens and an image is formed on the image sensing element 106. A drive coil 202 that amounts to a drive motor engages with a gear of the arm 201. When an electric current is supplied to the coil 202, the flow of the current causes the drive motor to rotate in a direction indicated by arrow 202k or in the opposite direction thereto. As the drive motor rotates the arm 201 also rotates about the shaft 205 in a direction indicted by arrow 202l or in the opposite direction thereto.

Stoppers 206a, 206b are positioning pins for when the arm 201 comes to the position shown in FIG. 29. By pressing the arm 201 against the stoppers 206a, 206b by an impelling force of the drive coil 202 the positioning accuracy is increased. In this position (the effective position), the splitter 103 directs the image sensing light flux to both the focus detection sensor 112 and the image sensing element 106. The focus detection sensor 112 also is disposed atop the arm 201 and rotates as a single unit with the splitter 103 about the shaft 205.

Thus, since the focus detection sensor 112 and the splitter 103 are integrally formed as a single unit as described above, focus detection error due to errors in the relative positions of the focus detection sensor 112 and the splitter 103 as the splitter 103 is inserted into and retracted from the light path can be eliminated.

In FIG. 30, the splitter 103 is fixed on the arm 201. Similarly the focus detection sensor 112 is also fixed on the arm 201. A light flux traveling along the optical axis 104 is directed not only to the image sensing element 106 but also to the focus detection sensor 112 by being reflected by two light-splitting surfaces inside the splitter 103 and a total reflection surface disposed therebetween. The arm 201 rotates about the shaft 205 so as to enable the exchange of the splitter 103 and the transparent panel 207 within the light path. When the splitter 103 is positioned at the retraction position and an electric current is applied to the drive coil 202, the arm 201 is subjected to a force exerted in the direction indicated by arrow 202l. As a result, the arm 201 starts to rotate clockwise about the shaft 205 and the splitter 103 is positioned at the retraction position.

Figure 31:
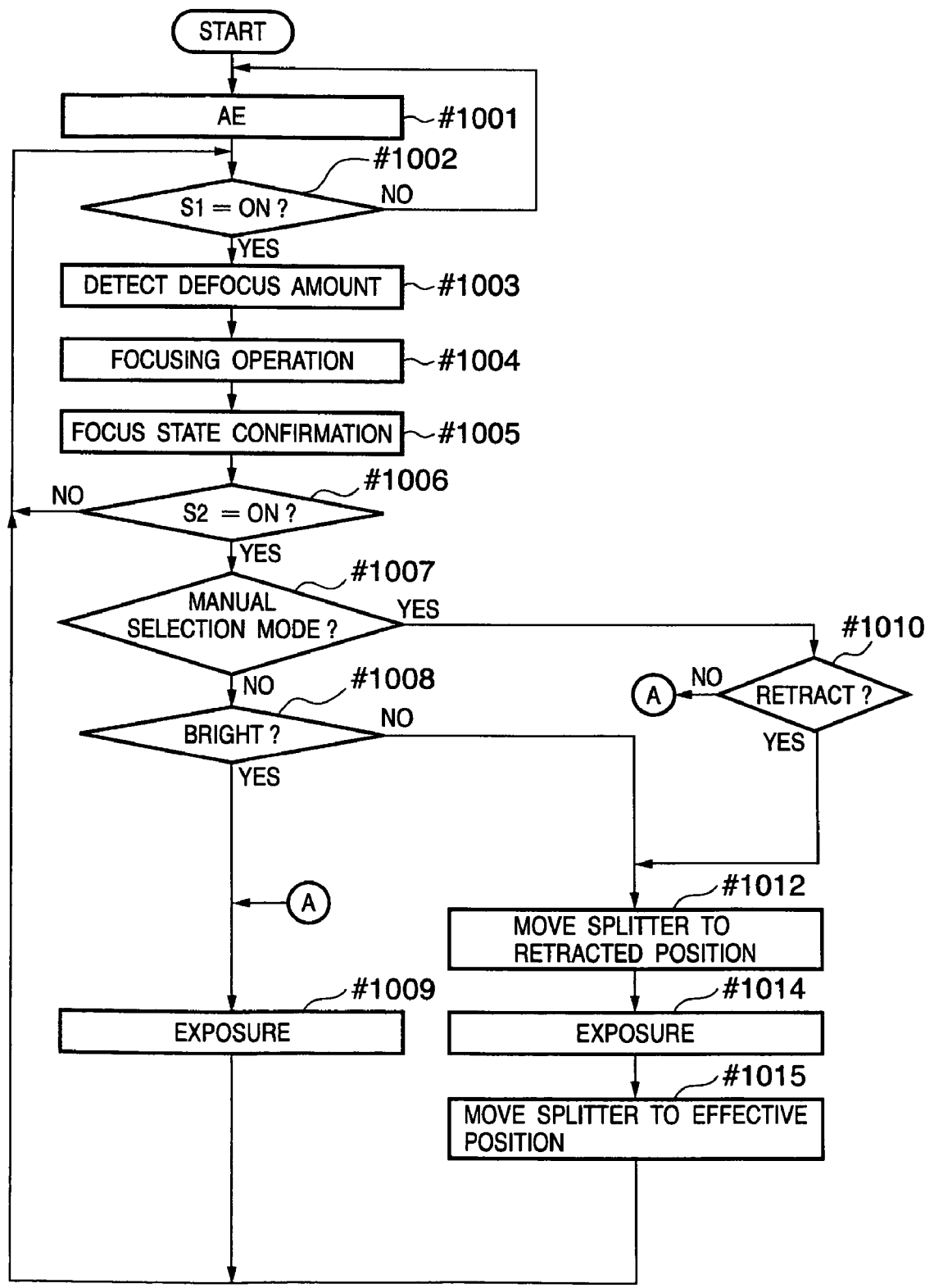
FIG. 31 is a flow chart illustrating the processes performed by the image sensing apparatus relating to the splitter in the second embodiment of the present invention.

FIG. 31 is a flow chart illustrating the operation of the mechanism shown in FIGS. 29 and 30 through an image sensing sequence of a camera. This sequence of operations starts when the camera power is turned on and ends when the power is turned off. It should be noted that, to avoid complication, descriptions of the operations of elements not directly related to the present invention and the detailed operation of each step (for example, confirmation after an operation or a standby operation with a timer) are omitted.

In step #1001, the image sensing element 106 is driven, object image information is collected, a variety of processes are carried out on the object image information with the RGB image processing circuit 131 and the YC processing circuit 132, and the processed object image information is output to the display device 107 so that the object image can be checked on the display device 107. In addition, during this series of processes the brightness of the object is obtained, and depending on that brightness, the diaphragm inside the lens barrel 105 is adjusted and signals output from the image sensing element 106 are boosted so as to enable an object image of appropriate brightness to be displayed on the display device 107. Furthermore, this brightness information is used in step #1008 to determine the necessity of retracting the splitter 103.

Next, in step #1002, the cycling of step #1001 continues in a standby mode until the shutter release button 111 is pressed halfway and S1=ON. Thereafter, when S1=ON, processing proceeds to step #1003. Then, in step #1003, charge corresponding to a light flux striking the focus detection sensor 112 through the splitter 103 is accumulated and detection of the defocus amount (detection of the focus state) is carried out. Thus, the splitter 103 normally is positioned within the optical path of the image sensing lens (the effective position shown in FIG. 29).

Next, in step #1004, in accordance with the focus detection results, part or all of the image forming optical system 102 is driven and the object image is focused on the surface of the image sensing element 106. Then, in the next step #1005, charge corresponding to the light flux striking the focus detection sensor 112 is again accumulated and the defocus amount is detected to confirm that the image is in focus. Although omitted from this sequence, if it is determined here that the focus is inadequate, then, based on that result, the image forming optical system 102 is again driven to correct the focus and the focus confirmation operation is repeated. If after multiple iterations of the operations described above the image is still out of focus, then a message indicating that the camera cannot focus is displayed, focusing is stopped and processing proceeds to step #1006.

In step #1006, it is determined whether or not the shutter release button 111 has been fully depressed and S2=ON. If it is determined that it is not S2=ON, then processing returns to step #1002. By contrast, if it is determined that S2=ON, then processing proceeds to step #1007. It should be noted that, although in the sequence shown in FIG. 31 processing does not proceed to step #1006 if the operations of steps #1003 to #1005 do not end, the present invention is not limited to such an arrangement, and thus, alternatively, processing may proceed to step #1006 even if focusing is not finished. In other words, processing may proceed to exposure by fully depressing the release button even in an out-of-focus state.

In step #1007, it is determined whether or not the camera is in a manual selection mode, in which, depending on the photographer's preference, the splitter 103 is to be positioned in the light path (the effective position shown in FIG. 29) or retracted from the light path. Thereafter, processing proceeds to step #1010 in the selection mode that enables selection by the photographer or to step #1008 in an automatic selection mode.

When proceeding from step #1007 to step #1008 in the automatic selection mode, it is determined whether or not to retract the splitter 103 from the light path during exposure based on the brightness of the object image obtained in step #1001 described above. The splitter 103 itself, as described above, decreases the amount of light that strikes the image sensing element 106. Therefore, in the case where an object to be sensed is bright which is typical of ordinary image sensing, the splitter 103 may be held in the light path at the effective position without adverse effect, but in the case where an object to be sensed is dark the splitter 103 is driven to the retracted position so that an adequate amount of light from the object strikes the image sensing element 106.

In step #1008 noted above, processing proceeds either to step #1012 if it is determined that it would be better to retract the splitter 103 to the retracted position or to step #1009 if the splitter 103 may be left at the effective position.

In step #1009, the exposure operation is carried out in a state in which the splitter 103 is positioned at the effective position in the light path. The exposure operation resets the charge accumulated in the image sensing element 106, and, after the lapse of a charge accumulation time that varies depending on the brightness of the object, shield the image sensing element 106 from light with a shutter or the like and reads out the accumulated charge. In addition, the read-out image sensing data is simultaneously recorded on a recording medium at this time. When exposure ends, although not shown in this sequence, if the shutter release button 111 continues to be pressed (S1, S2=ON), the camera enters a standby mode in step #1009, during which time the sensed image continues to be displayed on the display device 107. When the shutter release button 111 is released, the shutter is once again opened and processing returns to step #1002.

In step #1008 described above, when the object is dark and it is determined that it would be better that the splitter 103 be retracted during exposure, processing proceeds to step #1012 as described above and the splitter 103 is moved to the retracted position.

It should be noted that, in the first embodiment of the present invention as described above, in step #1011 shown in FIG. 28 it is determined if image sensing is still image sensing or moving image sensing and the splitter 103 is fixed at the effective position even if the object is dark in the case of moving image sensing. By contrast, in the second embodiment of the present invention, step #1011 is omitted, and thus, if the object is dark, the splitter 103 is retracted even in the case of moving image sensing so that an adequate amount of light can be obtained at the image sensing element 106. In that case, the focus detection using the focus detection sensor 112 cannot be conducted during moving image sensing. Of course, focusing is carried out from steps #1003 to #1005, and thus the object image is in focus at the start of moving image recording, but if the object image moves during moving image sensing or the photographer pans the camera, focus detection cannot be repeated.

However, the image sensing light flux is directed to the image sensing element 106 during moving image sensing, and therefore, based on that information, it is possible to continue focusing using the contrast of the object image (so-called TV-AF operation). In other words, if the object is dark, the splitter 103 is retracted even in the case of moving image recording so as to increase the amount of light striking the image sensing element 106 and to prevent the occurrence of noise. Accordingly, changes in focus may be detected using the signals output from the image sensing element 106 and the image forming optical system 102 may continue to be driven.

In addition, in the first embodiment described above, from step #1012 to step #1013 shown in FIG. 28, an optical member for correcting the light path length (the plane parallel plate 114) is inserted into the image sensing light flux (or, alternatively, the image forming optical system 102 may be driven along the optical axis) to compensate for the change in light path length brought about by the retraction of the splitter 103. By contrast, in the second embodiment, those steps are omitted because focus change compensation can be carried out by inserting the transparent panel 207 having the same thickness as the splitter 103 into the light path in place of the splitter 103.

In the succeeding step #1014 an exposure operation is carried out as in step #1009. Then, after exposure ends, although not shown in this sequence, if the shutter release button 111 continues to be pressed (S1, S2=ON), the camera enters a standby mode in step #1014, during which time the sensed image continues to be displayed on the display device 107. When the shutter release button 111 is released, the shutter is once again opened and processing proceeds to step #1015.

Next, in step #1015, the splitter 103 is moved to the effective position shown in FIG. 29 and processing returns to step #1002.

In addition, where processing proceeds to step #1010 in the selection mode in which the user selects the position of the splitter 103, it is determined if the splitter 103 is selected to be positioned at the effective position or to be positioned at the retracted position. Where effective position is selected, processing proceeds to step #1009 for exposure. By contrast, where the retracted position is selected, processing proceeds to step #1012 and the splitter 103 is retracted. Here, if it the retracted position is selected, the camera is constructed so that, in accordance with the user's selection, the splitter 103 is positioned at the retracted position regardless of whether the image is a still image or a moving image.

Thus, as described above, it is possible to select whether to position the splitter 103 in the light path during image sensing or to retract it from the light path during image sensing. As a result, even in an instance in which the object is bright and conventionally the image sensing diaphragm must be contracted, the attenuation of the amount of light by the splitter 103 eliminates the need to contract the image sensing diaphragm, and thus the effects of diffraction and the deepening of the depth of field that are caused by contracting the diaphragm can be avoided. In addition, if the object is dark, an adequate amount of light can still be directed to the image sensing element 106 by retracting the splitter 103.

With the structure described above, the effects of diffraction and the deepening of the depth of field that are caused by contracting the diaphragm can be avoided using a simple structure, and can obviate the need for an ND filter or other such mechanism. Moreover, the release time lag during image sensing can also be shortened. Furthermore, since the focus detection sensor 112 and the splitter 103 are integrated as a single unit, focus detection error due to errors in the relative positions of the focus detection sensor 112 and the splitter 103 as the splitter 103 is driven to the effective position and the retracted position can be eliminated.

Third Embodiment

Figure 32:
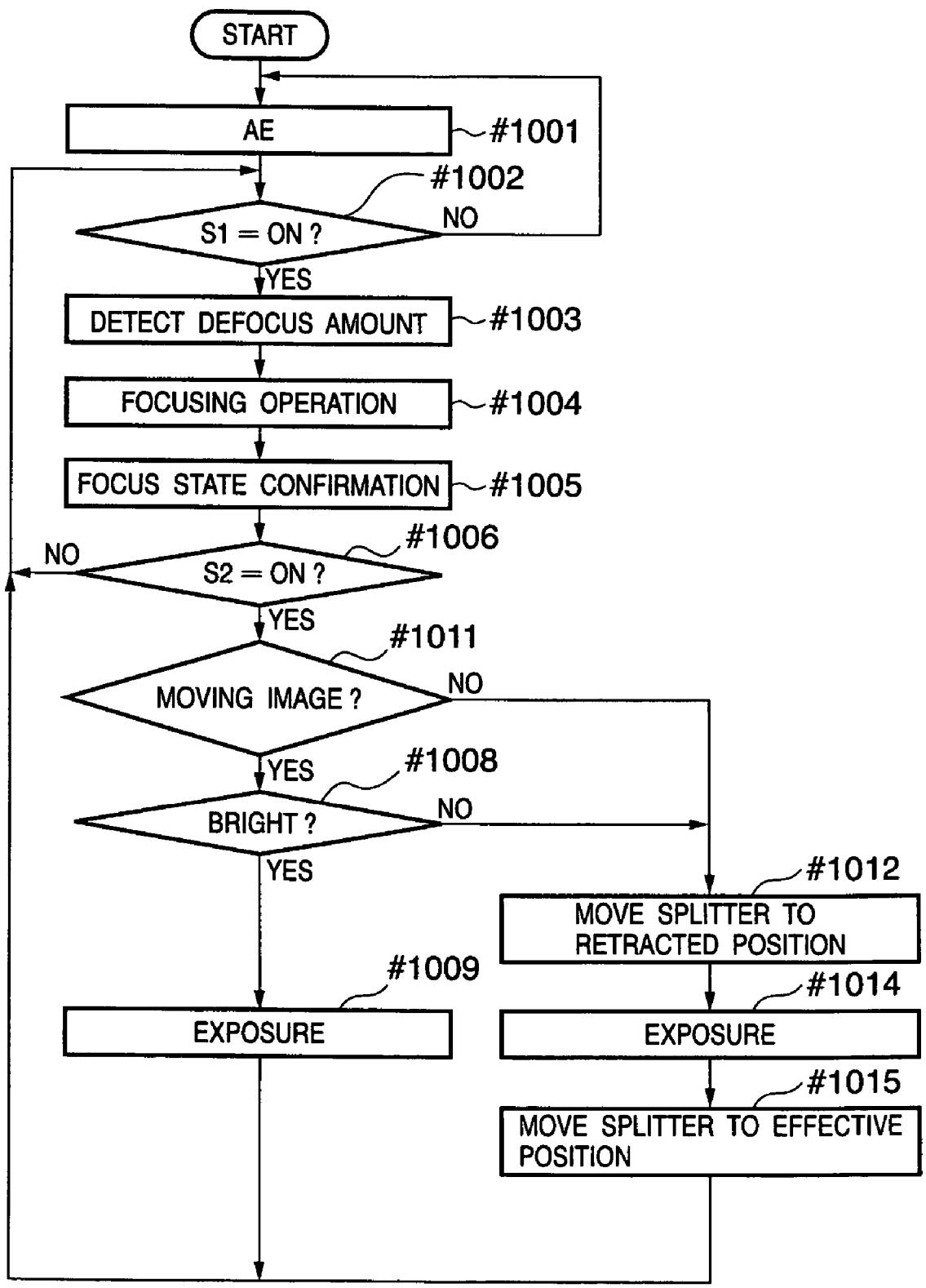
FIG. 32 is a flow chart illustrating the processes performed by the image sensing apparatus relating to the splitter in a third embodiment of the present invention.

FIG. 32 is a flow chart illustrating the operation of the main parts of a digital camera according to a third embodiment of the present invention. This sequence of operations starts when the camera power is turned on and ends when the power is turned off. It should be noted that, to avoid complication, descriptions of the operations of elements not directly related to the present invention and the detailed operation of each step (for example, confirmation after an operation or a standby operation with a timer) are omitted. In addition, the structures of the digital camera of the third embodiment are the same as those of the first or second embodiments described above.

In step #1001, the image sensing element 106 is driven, object image information is collected, a variety of processes are carried out on the object image information with the RGB image processing circuit 131 and the YC processing circuit 132, and the processed object image information is output to the display device 107 so that the object image can be checked on the display device 107. In addition, during this series of processes the brightness of the object image is obtained, and depending on that brightness, the diaphragm inside the lens barrel 105 is adjusted and signals output from the image sensing element 106 are boosted so as to enable an object image of appropriate brightness to be displayed on the display device 107. Furthermore, this brightness information is used in step #1008 to determine the necessity of retracting the splitter 103.

Next, in step #1002, the cycling of step #1001 continues in a standby mode until the shutter release button 111 is pressed halfway and S1=ON, after which, when S1=ON, processing proceeds to step #1003. Then, in step #1003, charge corresponding to a light flux striking the focus detection sensor 112 through the splitter 103 is accumulated and detection of the defocus amount (detection of the focus state) is carried out. Thus, the splitter 103 normally is positioned within the optical path of the image sensing lens (the effective position shown in FIGS. 26A and 26B or FIG. 29).

Next, in step #1004, in accordance with the focus detection results, part or all of the image forming optical system 102 is driven and the object image is focused on the surface of the image sensing element 106. Then, in the next step #1005, charge corresponding to the light flux striking the focus detection sensor 112 is again accumulated and the defocus amount is detected to confirm that the image is in focus. Although omitted from this sequence, if it is determined here that the focus is inadequate, then, based on that result, the image forming optical system 102 is again driven to correct the focus and the focus confirmation operation is repeated. If after multiple iterations of the operations described above the image is still out of focus, then a message indicating that the camera cannot focus is displayed, focusing operation is stopped and processing proceeds to step #1006.

In step #1006, it is determined whether or not the shutter release button 111 has been fully depressed and S2=ON. If it is determined that it is not S2=ON, then processing returns to step #1002. By contrast, if it is determined that S2=ON, then processing proceeds to step #1011. It should be noted that, although in the sequence shown in FIG. 32 processing does not proceed to step #1006 if the operations of steps #1003 to #1005 do not end, the present invention is not limited to such an arrangement, and thus, alternatively, processing may proceed to step #1006 even if focusing is not finished. In other words, processing may proceed to exposure by fully depressing the release button even in an out-of-focus state.

In step #1011, it is determined if the exposure mode involves moving image sensing or still image sensing, and processing proceeds either to step #1008 for moving image sensing or to step #1012 for still image sensing.

Proceeding to step #1008, photometry results obtained in step #1001 are examined. As a result, if the object is bright then processing proceeds to step #1009, and exposure is carried out with the splitter 103 being positioned at the effective position in the light path. The exposure operation resets the charge accumulated in the image sensing element 106, and, after the lapse of a charge accumulation time that varies depending on the brightness of the object image, shield the image sensing element 106 from light with a shutter or the like and reads out the accumulated charge. In addition, the read-out image sensing data is simultaneously recorded on a recording medium at this time. When exposure ends, although not shown in this sequence, if the shutter release button 111 continues to be pressed (S1, S2=ON), the camera enters a standby mode in step #1009, during which time the sensed image continues to be displayed on the display device 107. When the shutter release button 111 is released, the shutter is once again opened and processing returns to step #1002.

In step #1008 described above, when the object is dark and it is determined that it would be better that the splitter 103 be retracted during exposure, processing proceeds to step #1012 as described above and the splitter 103 is moved to the retracted position. Then, in the succeeding step #1014, an exposure operation is carried out as in step #1009. Then, after exposure ends, although not shown in this sequence, if the shutter release button 111 continues to be pressed (S1, S2=ON), the camera enters a standby mode in step #1014, during which time the sensed image continues to be displayed on the display device 107. When the shutter release button 111 is released, the shutter is once again opened and processing proceeds to step #1015.

Next, in step #1015, the splitter 103 is moved to the effective position and processing returns to step #1002.

Thus, as described above, in moving image sensing the splitter 103 can be held at either the effective position or the retracted position depending on image sensing conditions, and in still image sensing the splitter 103 is positioned at the retracted position during image sensing. As a result, with moving image sensing, even if the object is bright and the image sensing diaphragm must be contracted, the attenuation of the amount of light by the splitter 103 eliminates the need to contract the image sensing diaphragm, and thus the effects of diffraction and the deepening of the depth of field that are caused by contracting the diaphragm can be avoided. In addition, if the object is dark, an adequate amount of light can be directed to the image sensing element 106 by retracting the splitter 103. Moreover, with still image sensing, an adequate amount of light can still be directed to the image sensing element 106.

In other words, when the object in moving image sensing is bright, nimble focusing is possible using the focus detection sensor 112, and when the object is dark an adequate amount of light can still be provided to the image sensing element 106.

Although in the foregoing embodiments the description proceeds using a digital camera as an example, it should be noted that the present invention is not limited to a digital camera and can also be adapted to a video camera, a surveillance camera, a Webcam, a mobile phone equipped with an image sensing capability or the like.

The present invention is not limited to the above embodiments, and various changes and modifications can be made within the spirit and scope of the present invention. Therefore, to apprise the public of the scope of the present invention, the following claims are made.

This application claims the benefit of Japanese Patent Application No. 2005-113345 filed on Apr. 11, 2005, which is hereby incorporated by reference herein in its entirety.

What is claimed is:

1. An image sensing apparatus comprising:
   a light flux splitter disposed between a lens that focuses light flux of an object image on an image sensing surface and that image sensing surface and that branches the light flux of the object image out of an image sensing light path;
   a light receiving unit that receives the light flux of the object image branched by said light flux splitter and obtains a signal for focusing control of the lens;
   a holding unit that holds said light flux splitter at either an effective position within the image sensing light path or at a retracted position outside the image sensing light path; and
   a photometry unit that measures a brightness of an object image,
   wherein said holding unit automatically holds said light flux splitter at the effective position during image sensing in response to a moving image sensing being selected, if, at least, the brightness measured by said photometry unit is greater than a present threshold value, and said holding unit automatically holds said light flux splitter at the retracted position, otherwise.

2. The image sensing apparatus according to claim 1, wherein, when said holding means holds said light flux splitter at the retracted position during image sensing, an optical member for compensating the change in light path length caused by retraction of said light flux splitter from the effective position is inserted into the image sensing light path.

3. The image sensing apparatus according to claim 1, wherein, when said holding means holds said light flux splitter at the retracted position during image sensing, the lens is moved along the optical axis by an amount that compensates the change in a light path length caused by retraction of said light flux splitter from the effective position.

4. A control method for an image sensing apparatus having a light flux splitter disposed between a lens that focuses light flux of an object image on an image sensing surface and that image sensing surface and that branches the light flux of an object image out of an image sensing light path, a light receiving unit that receives the light flux of the object image branched by the light flux splitter and obtains a signal for focusing control of the lens, a holding unit that holds the light flux splitter at either an effective position within the image sensing light path or at a retracted position outside the image sensing light path; and a photometry unit that measures a brightness of an object image, the control method comprising:
   determining to carry out image sensing with the light flux splitter at the effective position during image sensing in response to a moving image sensing being selected, if, at least, the brightness measured by said photometry unit is greater than a present threshold value; and
   retracting the light flux splitter to the retracted position prior to image sensing if it is determined that image sensing is to be carried out with the light flux splitter positioned at other than the effective position.

* * * * *